US011742186B2

(12) United States Patent
Zong

(10) Patent No.: US 11,742,186 B2
(45) Date of Patent: **\*Aug. 29, 2023**

(54) MULTI-FUNCTIONAL PROTECTIVE COATING

(71) Applicant: Jiangsu Favored Nanotechnology Co., LTD, Wuxi (CN)

(72) Inventor: Jian Zong, Irvine, CA (US)

(73) Assignee: Jiangsu Favored Nanotechnology Co., LTD, Wuxi (CN)

( * ) Notice: Subject to any disclaimer, the term of this patent is extended or adjusted under 35 U.S.C. 154(b) by 313 days.

This patent is subject to a terminal disclaimer.

(21) Appl. No.: 16/688,845

(22) Filed: Nov. 19, 2019

(65) Prior Publication Data

US 2020/0083028 A1    Mar. 12, 2020

Related U.S. Application Data

(63) Continuation-in-part of application No. PCT/CN2017/113193, filed on Nov. 27, 2017, and a
(Continued)

(30) Foreign Application Priority Data

May 21, 2017  (CN) .......................... 201710360355.5
May 21, 2017  (CN) .......................... 201710360378.6
(Continued)

(51) Int. Cl.
*C23C 16/50*  (2006.01)
*H01J 37/32*  (2006.01)
(Continued)

(52) U.S. Cl.
CPC ........ *H01J 37/32532* (2013.01); *C23C 16/02* (2013.01); *C23C 16/0245* (2013.01);
(Continued)

(58) Field of Classification Search
CPC ....................................................... B05D 1/62
See application file for complete search history.

(56) References Cited

U.S. PATENT DOCUMENTS 4,085,248 A * 4/1978 Zehender ................ C23C 14/12
427/404
5,089,290 A * 2/1992 Kleeberg ............. B05D 3/0453
427/255.6
(Continued)

FOREIGN PATENT DOCUMENTS

CN          1265714 A       9/2000
CN          1643997 A       7/2005
(Continued)

OTHER PUBLICATIONS

International Search Report dated Feb. 14, 2018 cited in PCT/CN2017/113188.
(Continued)

*Primary Examiner* — David P Turocy
(74) *Attorney, Agent, or Firm* — Perkins Coie LLP

(57) ABSTRACT

Methods and apparatus for preparing a protective coating are described. In one example aspect, a method for preparing a protective coating includes positioning one or more target objects into a chamber. The chamber comprises a movable substrate and one or more trays coupled to the movable substrate to hold the one or more target objects such that the one or more target objects are movable within the chamber. The method also includes adding a monomer vapor into the chamber and performing a chemical vapor deposition process that comprises at least one cycle, each including a pretreatment phase and a coating phase.

15 Claims, 12 Drawing Sheets

Related U.S. Application Data continuation-in-part of application No. PCT/CN2017/113192, filed on Nov. 27, 2017, and a continuation-in-part of application No. PCT/CN2017/113191, filed on Nov. 27, 2017, and a continuation-in-part of application No. PCT/CN2017/113194, filed on Nov. 27, 2017, and a continuation-in-part of application No. PCT/CN2017/113190, filed on Nov. 27, 2017, and a continuation-in-part of application No. PCT/CN2017/113188, filed on Nov. 27, 2017, and a continuation-in-part of application No. PCT/CN2017/113189, filed on Nov. 27, 2017.

(30) Foreign Application Priority Data

| May 21, 2017 | (CN) | .......................... 201710360379.0 |
| May 21, 2017 | (CN) | .......................... 201710360380.3 |
| May 21, 2017 | (CN) | .......................... 201710360382.2 |
| May 21, 2017 | (CN) | .......................... 201710360383.7 |
| May 21, 2017 | (CN) | .......................... 201710361310.X |

(51) Int. Cl.

| C23C 16/52 | (2006.01) |
| C23C 16/02 | (2006.01) |
| C23C 16/458 | (2006.01) |

(52) U.S. Cl.

CPC .......... *C23C 16/4584* (2013.01); *C23C 16/50* (2013.01); *C23C 16/52* (2013.01); *H01J 37/32009* (2013.01); *H01J 37/32449* (2013.01); *H01J 37/32715* (2013.01); *H01J 37/32743* (2013.01); *H01J 2237/3321* (2013.01); *H01J 2237/3341* (2013.01)

(56) References Cited

U.S. PATENT DOCUMENTS

| 7,201,935 | B1 * | 4/2007 | Claude | .................... A61L 31/14 |
| | | | | 427/407.1 |
| 10,934,623 | B2 * | 3/2021 | Zong | ...................... B05D 3/147 |
| 11,587,772 | B2 * | 2/2023 | Zong | ................. H01J 37/32743 |
| 2005/0015105 | A1 * | 1/2005 | Tang | ...................... A61L 29/085 |
| | | | | 606/192 |
| 2008/0146734 | A1 | 6/2008 | Youngblood et al. | |
| 2013/0116682 | A1 * | 5/2013 | Koo | ...................... C23C 16/513 |
| | | | | 606/41 |
| 2016/0284518 | A1 * | 9/2016 | Legein | ...................... B05D 5/08 |

FOREIGN PATENT DOCUMENTS

| CN | 1953022 | A | 4/2007 |
| CN | 102821873 | A | 12/2012 |
| CN | 103160786 | A | 6/2013 |
| CN | 203174194 | U | 9/2013 |
| CN | 103782366 | A | 5/2014 |
| CN | 204803400 | U | 11/2015 |
| CN | 204874717 | U | 12/2015 |
| CN | 105705590 | A | 6/2016 |
| CN | 106622824 | A | 5/2017 |
| CN | 106637140 | A | 5/2017 |
| CN | 206219660 | U | 6/2017 |
| CN | 106958012 | A | 7/2017 |
| CN | 107142465 | A | 9/2017 |
| CN | 107142466 | A | 9/2017 |
| CN | 107177835 | A | 9/2017 |
| CN | 107201510 | A | 9/2017 |
| CN | 107201511 | A | 9/2017 |
| CN | 107217243 | A | 9/2017 |
| DE | 10317208 | A1 | 11/2004 |
| EP | 0049884 | A1 | 4/1982 |
| WO | 2018214446 | A1 | 11/2018 |
| WO | 2018214447 | A1 | 11/2018 |
| WO | 2018214448 | A1 | 11/2018 |
| WO | 2018214449 | A1 | 11/2018 |
| WO | 2018214450 | A1 | 11/2018 |
| WO | 2018214451 | A1 | 11/2018 |
| WO | 2018214452 | A1 | 11/2018 |

OTHER PUBLICATIONS

International Search Report dated Feb. 9, 2018 cited in PCT/CN2017/113189.

International Search Report dated Feb. 7, 2018 cited in PCT/CN2017/113190.

International Search Report dated Feb. 22, 2018 cited in PCT/CN2017/113191.

International Search Report dated Feb. 13, 2018 cited in PCT/CN2017/113192.

International Search Report dated Feb. 24, 2018 cited in PCT/CN2017/113193.

International Search Report dated Feb. 23, 2018 cited in PCT/CN2017/113194.

Peng Li, et al., "Antifouling Performance for Polyvinylidene Fluoride Membrane Modified by Plasma Treatment in a MBR", Membrane Science and Technology, Jun. 30, 2014, vol. 34, No. 3.

* cited by examiner

MULTI-FUNCTIONAL PROTECTIVE COATING

CROSS REFERENCE TO RELATED APPLICATIONS

This patent document is a continuation in part of and claims the benefit of priority to: International Patent Application No. PCT/CN2017/113188, filed on Nov. 27, 2017, which claims the benefit of priority to Chinese Patent Application No. 201710361310.X, filed on May 21, 2017; International Patent Application No. PCT/CN2017/113189, filed on Nov. 27, 2017, which claims the benefit of priority to Chinese Patent Application No. 201710360355.5, filed on May 21, 2017; International Patent Application No. PCT/CN2017/113190, filed on Nov. 27, 2017, which claims the benefit of priority to Chinese Patent Application No. 201710360383.7, filed on May 21, 2017; International Patent Application No. PCT/CN2017/113191, filed on Nov. 27, 2017, which claims the benefit of priority to Chinese Patent Application No. 201710360382.2, filed on May 21, 2017; International Patent Application No. PCT/CN2017/113192, filed on Nov. 27, 2017, which claims the benefit of priority to Chinese Patent Application No. 201710360378.6, filed on May 21, 2017; International Patent Application No. PCT/CN2017/113193, filed on Nov. 27, 2017, which claims the benefit of priority to Chinese Patent Application No. 201710360379.0, filed on May 21, 2017; and International Patent Application No. PCT/CN2017/113194, filed on Nov. 27, 2017, which claims the benefit of priority to Chinese Patent Application No. 201710360380.3, filed on May 21, 2017. The entire contents of the before-mentioned patent applications are incorporated by reference as part of the disclosure of this application.

TECHNICAL FIELD

This patent document is related to the technical field of protective coating, and more particularly, to preparing a multi-functional protective coating using plasma chemical vapor deposition.

BACKGROUND

Corrosive environment is the most common factor for damages to electronic devices. Environmental corrosion gives rise to corrosion of solid materials, degradation of insulation performance of conductors and semiconductors, and other failures, such as short circuit, open circuit or poor contact in electronic devices. Among products in high-tech industries such as national defense and aerospace, electronic parts account for an increasingly great share. The requirements on properties of electronic products, such as moisture resistance, mold resistance and corrosion resistance, are becoming increasingly strict. Similarly, in the field of communications, the requirements on heat dissipation of communication devices and stability and reliability of signal transmission have become higher. Thus, a reliable method is needed for providing effective protection for circuit boards and electronic elements for different protection requirements, while not affecting normal heat dissipation and signal transmission.

SUMMARY

This patent document describes, among other things, techniques for preparing a protective coating that can satisfy different protection requirements.

In one example aspect, an apparatus for preparing a protective coating comprises a chamber, a substrate positioned within the chamber configured to hold at least a target object, an inlet pipe configured to direct a monomer vapor into the chamber, and one or more electrodes configured to perform a chemical vapor deposition process to produce a multi-layer coating. The chemical vapor deposition process comprises multiple cycles, each cycle comprising a pretreatment phase and a coating phase to produce a layer of the multi-layer coating. The one or more electrodes are configured to, for a first cycle of the multiple cycles, apply, in the pretreatment phase, a first type of a discharge at a first power level for a first time duration, and apply, in the coating phase, a second type of a discharge at a second power level for a second time duration to produce a first layer of coating having a first density. The second power level is lower than the first power level. The one or more electrodes are further configured to adjust at least one of the second type of the discharge or the second power level in a second cycle of the multiple cycles to produce a second layer having a different density.

In another example aspect, an apparatus for controlling a protective coating process comprises a processor, and a memory including processor executable code. The processor executable code upon execution by the processor configures the processor to control one or more electrodes during a chemical vapor deposition process to produce a multi-layer coating on a target object. The chemical vapor deposition process comprises multiple cycles, each cycle comprising a pretreatment phase and a coating phase to produce a layer of the multi-layer coating. The processor is configured to control the one or more electrodes to, for each cycle, apply a first type of a discharge at a first power level for a first time duration in the pretreatment phase, and apply a second type of a discharge at a second power level for a second time duration in the coating phase. The second power level is lower than the first power level. The processor is further configured to control the one or more electrodes to adjust, for different cycles in the chemical vapor deposition process, at least one of: the first type of discharge, the second type of discharge, the first power level, the second power level, the first time duration, or the second time durations.

In another example aspect, a method for preparing a protective coating comprises positioning a target object into a chamber, adding a monomer vapor into the chamber, and performing a chemical vapor deposition process such that the monomer vapor forms a multi-layer protective coating on surfaces of the target object. The chemical vapor deposition process comprises multiple cycles, each cycle comprising a pretreatment phase and a coating phase to prepare a layer of the multi-layer coating. In the pretreatment phase, a first type of a discharge is applied at a first power level for a first time. In the coating phase, a second type of a discharge is applied at a second power level for a second time duration, the second power level being lower than the first power level. The method also includes adjusting, for different cycles in the chemical vapor deposition process, at least one parameter of the chemical vapor deposition process to produce layers having different densities or thicknesses. The at least one parameter includes the first type of discharge, the second type of discharge, the first power level, the second power level, the first time duration, or the second time durations.

In another example aspect, a method for preparing a protective coating comprises positioning one or more target objects into a chamber. The chamber comprises a movable substrate and one or more trays coupled to the movable substrate configured to hold the one or more target objects such that the one or more target objects are movable within the chamber. The method comprises adding a monomer vapor into the chamber and performing a chemical vapor deposition process such that the monomer vapor forms a protective coating on surfaces of the one or more target objects. The chemical vapor deposition process comprises at least one cycle, the at least one cycle comprising a pretreatment phase and a coating phase. In the pretreatment phase, a first type of a discharge is applied at a first power level for a first time duration. In the coating phase, a second type of a discharge is applied at a second power level for a second time duration, the second power level being lower than the first power level.

In yet another example aspect, an apparatus for preparing a protective coating comprises a chamber and a movable substrate positioned within the chamber. The movable substrate coupled to one or more trays configured to hold at least a target object. The apparatus also includes an inlet pipe configured to direct a monomer vapor into the chamber and one or more electrodes configured to perform a chemical vapor deposition process. The chemical vapor deposition process comprises at least one cycle, the at least one cycle comprising a pretreatment phase and a coating phase. In the pretreatment phase, a first type of a discharge is applied at a first power level for a first time duration. In the coating phase, a second type of a discharge is applied at a second power level for a second time duration, the second power level being lower than the first power level.

These, and other, aspects are described in the present document.

DETAILED DESCRIPTION

Figure 1A:
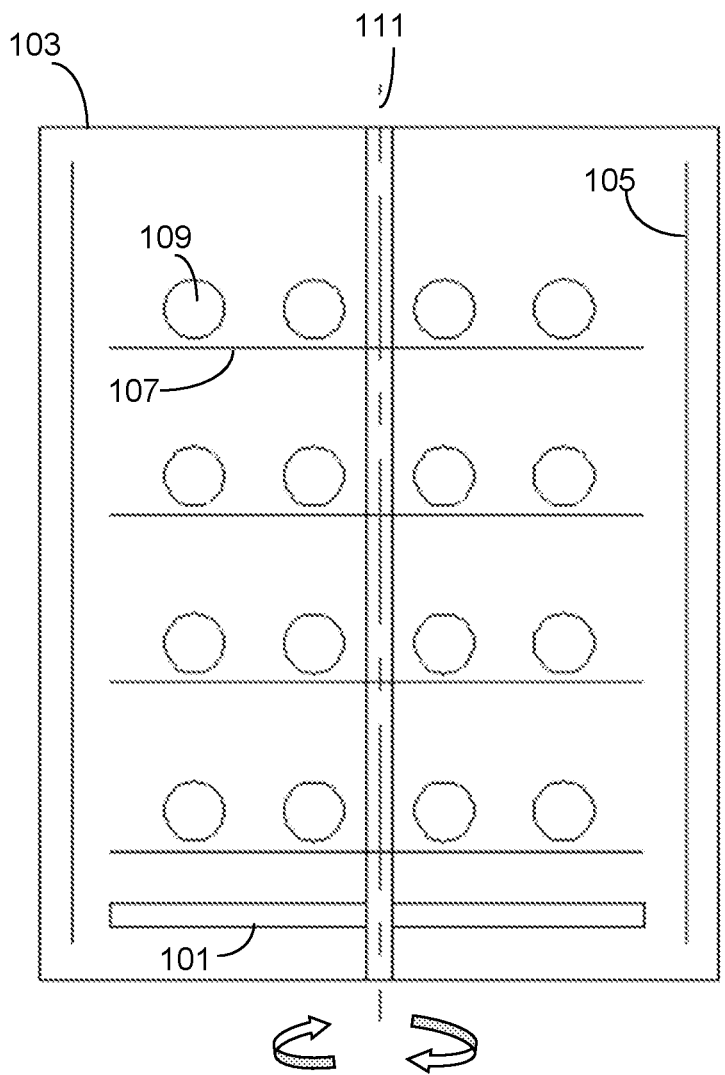
FIG. 1A is a front view of an example apparatus for preparing a protective coating in accordance with the present disclosure.

Characterized by economic efficiency, easy application and a wide range of applications, polymer coating is usually used for protection of material surfaces. Polymer coating can provide good physical and chemical durability for various materials. The barrier property of polymer coating allows a protective film to form on the surface of electronic products and circuit boards, effectively isolating circuit boards and protect circuits from corrosion and damages in a corrosive environment and thereby improving the reliability of electronic devices, enhancing their safety factors and ensuring their service lives.

Conformal coating is a technological process during which a specific material is applied on a Printed Circuit Board (PCB) to form an insulation protective layer having same shape as the coated object. As a common waterproof method for circuit boards, conformal coating can effectively isolate circuit boards and protect circuits from corrosion and damages under adverse environments. However, there are some problems and drawbacks with current preparation processes of conformal coating. For example, solvents in the liquid phase method tend to cause damages to circuit board devices. The high temperature for heat curing of coatings tends to cause damages to devices. It is also hard for photo-cured coating to reach the interior of closed devices.

Union Carbide Co. in the U.S.A. developed and applied a new conformal coating material: Parylene coating. Parylene is a polymer of p-xylene. Featured by low moisture and gas permeability as well as high barrier effect, Parylene coating is moisture proof, water proof, rust proof, and acid and alkali resistant. Poly-p-xylylene can be produced through deposition in a vacuum state and it can be applied in the fields where liquid coating cannot be involved, such as the protection of high frequency circuits and extremely weak current systems. The thickness of a polymer film coating is the main reason that causes the protection by a conformal coating formed by vapor deposition of poly-p-xylylene to fail. In the case that the thickness of a polymer film coating on a PCB assembly is within a range of 3-7 micrometers, localized rust tends to occur and the coating fails to provide protection. The coating needs to be thick (e.g., equal to or greater than 30 micrometers) to ensure that high frequency dielectric loss is not affected. Parylene coating has relatively high requirements for the pretreatment of printed circuit boards to be protected. For conducting assemblies, signal transmission assemblies, and radio frequency assemblies, masking pretreatment needs to be performed on circuit board assemblies at the time of vapor disposition to form a conformal coating so as to avoid impact on properties of the assemblies. This disadvantage greatly restricts the application of Parylene coating. It is thus difficult to widely apply Parylene coating due to costly raw materials for preparation thereof, strict conditions for the coating preparation (requirements of high temperature and high vacuum degree), and low film forming speed. In addition, a thick coating tends to give rise to issues like poor heat dissipation, signal blocking, more coating defects.

Plasma chemical vapor deposition (PCVD) is a technology that uses plasma to activate reaction gases, to facilitate chemical reactions on a target object surface or in a space near a surface, and to generate solid films. Coatings formed with PCVD have the following advantages:

(1) It is a dry process. Films formed using PCVD are even without pinholes.

(2) Plasma polymer films have stable chemical and physical properties, such as solvent resistance, chemical resistance, heat resistance and wear resistance.

(3) Plasma polymer films are well bonded to a target object.

(4) A uniform thin film can also be formed on an extremely uneven and irregular target object surfaces.

(5) The temperature for coating preparation is low. Thus, coating preparation can be carried out at normal temperature, thereby effectively avoiding damages to temperature sensitive devices.

(6) The plasma techniques can be used for the preparation of coating with a micrometer-level thickness. They can also be used for the preparation of ultrathin protective coating.

Using the chemical vapor deposition technology, P2i Company in the U.K. developed a polymer protective coating based on a specific low duty ratio pulse discharge. The duty ratio is lower than 1:1000; that is, the duty cycle is 1/1000, or 0.1%. However, the preparation process based on the specific low duty ratio pulse discharge cannot realize an effective combination and control between the energy provided and bond lengths and bond energies of different groups in raw chemical materials or molecular weights of the materials. Moreover, the scratch resistance and durability of the prepared coating are not ideal. Limited by the properties of this coating, currently, only a lyophobic protective coating can be formed on electronic and electrical devices. The lyophobic protective coating cannot effectively provide resistance to a corrosive environment. Furthermore, the compact protective coating prepared using the specific low duty ratio pulse discharge method has fatal defects. From a microscopic angle, a low power density during a coating process is not conductive to the formation of compact structures, and may even be unable to form stable film structures. Further from a macroscopic angle, a low power density is not conductive to the high-speed growth of coating, and the efficiency is low in actual production, which limits its applications.

In existing preparation processes of plasma chemical vapor deposition coating, target objects are always fixed. That is, there is no relation between the movement of the target object and the plasma discharge energy. A continuous discharge (that is, the power of the discharge is continuously supplied) is applied process the static target object(s) in a chamber. Under the continuous discharge, activated broken chains in monomers combine into a film through simple piling. The obtained coating may have a loose structure and high pulverization degree, which is not conductive to the formation of micro compact structure of the coating. Thus, the coating has poor protective properties, such as water resistance, moisture resistance, corrosion resistance and solvent resistance.

Since the plasma and raw chemical materials have different densities in different regions of a reaction chamber, and the target object remains motionless, the coating deposition velocity is slow in some areas, which leads to a low production efficiency. Moreover, in some cases, uniformity and compactness are significantly different.

The techniques disclosed herein address the issues discussed above and can be implemented in various embodiments to prepare a protective coating suitable to provide protection for different functions and/or requirements (e.g., moisture resistance, mold resistance and/or corrosion resistance). In particular, the disclosed techniques allow fabrication of a more complex, multi-layer protective coating. The structure of the coating (e.g., thickness and/or density of the layers) can be varied by controlling the power level(s) and discharge duration(s) in a PCVD process to achieve desirable corrosion-resistance and durability as well as good functional properties. Some example aspects of the disclosed techniques are described in the following operations.

Operation (1):

One or more target objects are placed into a reaction chamber of protective coating preparation equipment, which is described in detail in connection with FIGS. 1A-4B. The reaction chamber is vacuumed continuously until the vacuum degree in the reaction chamber is in a range of 10-200 millitorr. An inert gas (e.g., He or Ar) is then added to the chamber.

In some embodiments, the reaction chamber includes a substrate that can further be coupled to one or more trays to hold the target object(s). The substrate can move in the reaction chamber using a movement mechanism to achieve a more compact structure. The movement of the substrate can be a straight reciprocating motion or curvilinear motion relative to the reaction chamber. The curvilinear motion includes circular motion, elliptic motion, planetary motion, spherical motion and/or curvilinear motion of other irregular routes. The movement of the substrate can increase the coating deposition efficiency and improves the uniformity and compactness of the coating thickness on the target object(s).

In some embodiments, the target object can be a solid material. The solid material can be electronic products, electrical components, assembled electronic semi-finished products, PCB boards, metal plates, Teflon plates or electronic parts and components. When the object surface is provided with a multi-functional protective coating, any of the surfaces can be exposed to an environment of water, fungi, acidic or alkaline solvents, acidic or alkaline salt spray, acidic atmosphere, organic solvent immersion, cosmetics, perspiration, thermal cycling impact or alternating dampness and heat.

In some embodiments, the volume of the reaction chamber can be between 50-1000 L. The temperature of the reaction chamber is controlled within the range of 30-60° C., and the incoming flow of the inert gas is 5-300 sccm. The reaction chamber can be a rotary chamber or a cubic chamber.

Operation (2):

A monomer vapor is sent into the reaction chamber via a feeding pump until the vacuum degree reaches 30-300 millitorr. The introduction of a monomer vapor is to atomize and volatilize the monomer through the feeding pump. The monomer vapor can be introduced to the reaction chamber using a low pressure of 10-200 millitorr. The corresponding incoming flow of the monomer can be 10-1000 μL/min.

The components of the monomer vapor can include a mixture of at least one monofunctional unsaturated fluorocarbon resin and at least one polyfunctional unsaturated hydrocarbon derivative. The mass fraction of the polyfunctional unsaturated hydrocarbon derivative in the monomer vapor can be 15-65%. In some embodiments, the monofunctional unsaturated fluorocarbon resin includes: 3-(perfluoro-5-methyl hexyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluoro octyl ethyl acrylate, 1H, 1H, 2H, 2H-perfluoro octanol acrylate, 2-(perfluorobutyl) ethyl acrylate, (2H-perfluoro propyl)-2-acrylate, (perfluoro cyclohexyl) methyl acrylate, 3,3,3-trifluoro-1-propyne, 1-ethinyl-3,5-difluorobenzene or 4-ethinyl trifluorotoluene. In some embodiments, the polyfunctional unsaturated hydrocarbon derivative includes: Ethoxylated trimethylolpropane triacrylate, tripropylene glycol diacrylate, poly (ethylene glycol) diacrylate, 1,6-hexanediol diacrylate, diacrylic gylcol ester, diethylene glycol divinyl ether, or neopentyl glycol diacrylate.

Under the low vacuum plasma discharge environment, chemical bonds of the monomers with an active molecular structure are broken via the effective output of energy, and free radicals of high activity are formed. The free radicals in the excited state and the activated groups on surfaces of the target object initiate polymerization via chemical bond combination to form a thin membrane (e.g., a nano membrane) and to form a multi-functional protective coating on the surface.

In some embodiments, the introduction of polyfunctional cross linked structures in monomer materials promotes the formation of a compact mesh structure of the coating in terms of microstructure. The polyfunctional cross linked structures can also improve the acid/alkali corrosion resistance of the coating in various environments while ensuring hydrophobicity. Monofunctional monomers can be selected for general plasmas polymerization to obtain a coating of a cross-linked structure. The cross-linked structure can be formed by the cross-linking of active sites that are generated from the broken chains in monomers at the time of plasma discharging. However, such cross-linked structures are relatively loose and may have many linear components. Thus, the corresponding permeability resistance and dissolubility are poor. Through the introduction of other monomer components of polyfunctional cross-linked structures, additional cross-linking points are added to form cross-linked structures. At the time of plasma discharging, the active groups with high energy in monomer components can be broken through the effective control and output of energy and under the action of low temperature plasmas to form active sites. The introduced additional active sites carry out cross-linking and polymerization with each other in the plasma environment, thereby forming compact mesh structures.

Compared with coating structures of many loose linear components, the mesh structure formed using techniques disclosed herein has better compactness and can effectively improve the corrosion resistance of a film. In a plasma environment, the surface of the coated object is activated to obtain numerous active sites. Such active sites can, through strong chemical bonds, be bonded with the active free radicals of a monomer material activated by plasmas, leading to elementary reactions of various forms and types such that the nano film of the target object has an excellent binding force and mechanical strength. Effective control and adjustment of corrosion resistance on the material surface can be realized by controlling combinations of different monomers and different process conditions. The structure can have a special microstructure—a compact base layer and a rough surface layer can be obtained. The corresponding environmental corrosion resistance of the structure can be improved by 20%-45%.

In some embodiments, polymer protective coating of a composite and gradually changed structure is obtained by introducing other monomer components with cross-linked structures, controlling the monomer ratio, providing the equipment corresponding energy outputs and effective changes of process parameters according to differences in molecular bond energies, bond lengths and vaporization temperatures of different monomers, which not only ensures the hydrophobicity of the film, but also improves the resistance of electronic products and other products against corrosive environment.

Operation (3):

A protective coating is prepared through a chemical vapor deposition process on the target object surface. The deposition process includes two different phases: a pretreatment phase and a coating phase. The purpose of the pretreatment phase is to activate the target object surface and form lots of active sites on the target object surface. The plasma generated during the plasma discharge and deposition has an etching effect on the deposition film. A high-power level discharge is often used in the pretreatment phase to prepare and clean the target surface. The use of high-power plasma discharge in the pretreatment phase not only can remove impurities from the target object surface, but also can activate the target object surface so that the target object surface is conductive to the coating deposition, thereby improving the binding force between the coating and the target object. In some embodiments, the pretreatment phase uses a high-power plasma discharge mode with a continuous discharge at a power level of 120-400 W.

The discharging time of the pretreatment phase can be determined based on the desired amount of etching and the surface properties of the target object. In some cases, certain types of target object surfaces (e.g., LED/OLED screen of mobile devices) may be damaged if the discharging time is too long. However, insufficient discharging time in the pretreatment phase may not achieve the desired etching effect.

A second, different discharge is used for the coating phase. In the coating phase, the discharge combined with the kinetic characteristics of the target object is conductive to speeding up the chemical deposition. In general, the power-level of the coating phase is lower than the power-level of the pretreatment phase, as high power level may destroy the molecular structure of the monomer materials during the coating phase. The discharging time of the coating phase can be determined based on the desired coating thickness, which in turn affects protective performance of the coating. For example, the second discharge mode can be a low power (10-75 W) continuous discharge. In some embodiments, the second discharge mode can be a high duty ratio pulse discharge with a power between 50-200 W. The corresponding discharge time is in a range of 600-7200 s, the pulse frequency is in a range of 1-1000 Hz, and the pulse duty ratio is 1:1-1:800 (that is, the duty cycle is between $\frac{1}{800}$-1, or 0.125%-100%). In some embodiments, a periodic alternating discharge is used. The power can be in a range of 50-200 W with a discharging time of 600-3600 s. The alternating frequency can be between 1 to 1000 Hz.

In some embodiments, a continuous low power discharge is introduced in the coating phase. During the continuous discharge, two processes including polymerization and etching occur at the same time. On one hand, molecular chains in the excited state broken by plasmas are bonded to the active sites on the target surface via chemical bonds. On the other hand, plasmas etch molecular chains of low chemical bond energy on the surface after polymerization and play a role of activation, thereby generating a more compact polymerized protective coating.

In some embodiments, a high duty ratio pulse discharge is adopted in the coating phase. The pulse discharge can generate plasmas with sufficient energy to break up the incoming monomer segments to form more excited chain segments. When the segment ends in the excited state bond, via active sites having certain energy and activity in the monomer material, more and more complicated elementary reactions happen, and a more compact cross-linked netlike structure can be formed with active sites having corresponding energy on the target object surface in a form of chemical bonds. When using the high duty ratio pulse discharge, the discharge mode can form thicker and more compact films within a certain period of time, and the coating efficiency is higher. Thus, it can solve the fatal weakness of the compact protective coating prepared by P2i Company in the U.K. with the method based on a specific low duty ratio pulse discharge.

In some embodiments, a periodic alternating discharge is adopted in the coating phase. Similar to the pulse discharge, the periodic alternating discharge can generate plasmas with sufficient energy to break up the incoming monomer segments to form more excited chain segments. When the segment ends in the excited state bond, via active sites having certain energy and activity in the monomer material, more and more complicated elementary reactions happen, and a more compact cross-linked netlike structure can be formed with active sites having corresponding energy on the target object surface in a form of chemical bonds.

The plasma discharge for both phases can be radio frequency discharge, microwave discharge, intermediate frequency discharge, high frequency discharge or spark discharge. The waveforms of high frequency discharge and intermediate frequency discharge can be sinusoidal or bipolar pulses. The radio frequency plasmas are generated from the discharge of high frequency electromagnetic field. In some embodiments, microwave discharge can be used to activate plasmas using microwave energy, thereby achieving high energy utilization efficiency while obtaining plasmas that are pure due to electrodeless discharge. The output waveform of a plasma periodic alternating discharge can be a sawtooth waveform, sinusoidal waveform, square waveform, or bun shape waveform.

In some embodiments, the pretreatment and the coating phases are cyclically repeated at least once before proceeding to the subsequent operations. That is, the chemical vapor deposition process includes multiple cycles, each having a pre-treatment stage and a coating stage. When the pretreatment and coating phases are cyclically repeated for multiple times, the high-power pretreatment after each coating can further form active sites on the coating film surface, thereby activating the surface of a coating layer. Each coating layer then becomes favorable for the further deposition of the coating, which improves the binding force between the coating layers. A multi-layer coating structure with higher binding force and compactness can thus be formed using the cyclic coating process. Experiments have shown that, as compared with a conventional single-layer coating, the binding force and compactness using the cyclic coating process can be improved by at least 20%-40% and 15%-30%, respectively. The number of cyclical repetitions affects the resulting thickness of the coating and can be determined based on the protection requirements of different applications.

In some embodiments, the power level for each cyclic repetition remains the same. That is, the pretreatment and coating phase each has a corresponding power level that remains the same in different cycles. Each layer of the resulting multi-layer coating structure thus has substantially the same thickness. The number of repetitions can be determined according to the protection requirements.

In some embodiments, different power levels can be used for different cycles of the pretreatment and coating phases to achieve a more complex multi-layer structure. Different power levels can lead to layers with different properties. For example, although the monomer remains the same, layers formed with high power level are dense with higher corrosion-resistance and higher durability due to the high energy acting on the gas phase monomer and the coating surface. On the other hand, the functional properties may be affected by the high power level due to excess dissociation of the monomer molecules. Layers formed with low power level are usually well functional due to less dissociation of the monomer molecules in the weak plasma, but the mechanical property and the corrosion-resistance may not be ideal. By combining different power levels during the cyclically repetition process, a multi-layer structure that demonstrate high corrosion-resistance and durability as well as good functional properties can be achieved. Experiments have shown that a polymer coating comprising one or more dense layers with one or more loose layers (e.g., a dense base layer and a loose top layer) demonstrates both good functional and mechanical properties while providing good corrosion resistance. For different target object materials and different protection requirements, discharge powers and time in the cycles can be empirically determined. For example, the discharge powers and discharge time durations for each cycle as well as the number of cycles required can be determined based on the required wearability of the target object(s).

In some embodiments, the target object moves in the reaction chamber via the substrate and/or the one or more trays during the pretreatment and coating phases. The movement allows the coating thicknesses at different positions of the target object to be consistent, thereby solving the issue of uneven coating thickness on the target surfaces caused by different monomer densities in different areas of the reaction chamber. The target object's movement when plasma discharge energy is applied can increase the deposition efficiency and greatly improve the compactness of the obtained multi-functional protective coating. Due to the improved efficiency, the amount of chemical monomer raw materials applied in the monomer vapor can be only 10%-15% of the applied amount using existing technology, thereby reducing the emission of exhaust and waste gases and becoming more environmentally friendly.

Operation (4):

When the coating is completed, the introduction of the monomer vapor is stopped. The plasma discharge is stopped as well. The reaction chamber is vacuumed continuously for 1-5 minutes to keep the vacuum degree of the reaction chamber in the scope of 10-200 millitorr. Regular air is then introduced to the chamber to bring the pressure back to one barometric pressure. The target object can then be removed from the chamber.

Figure 1B:
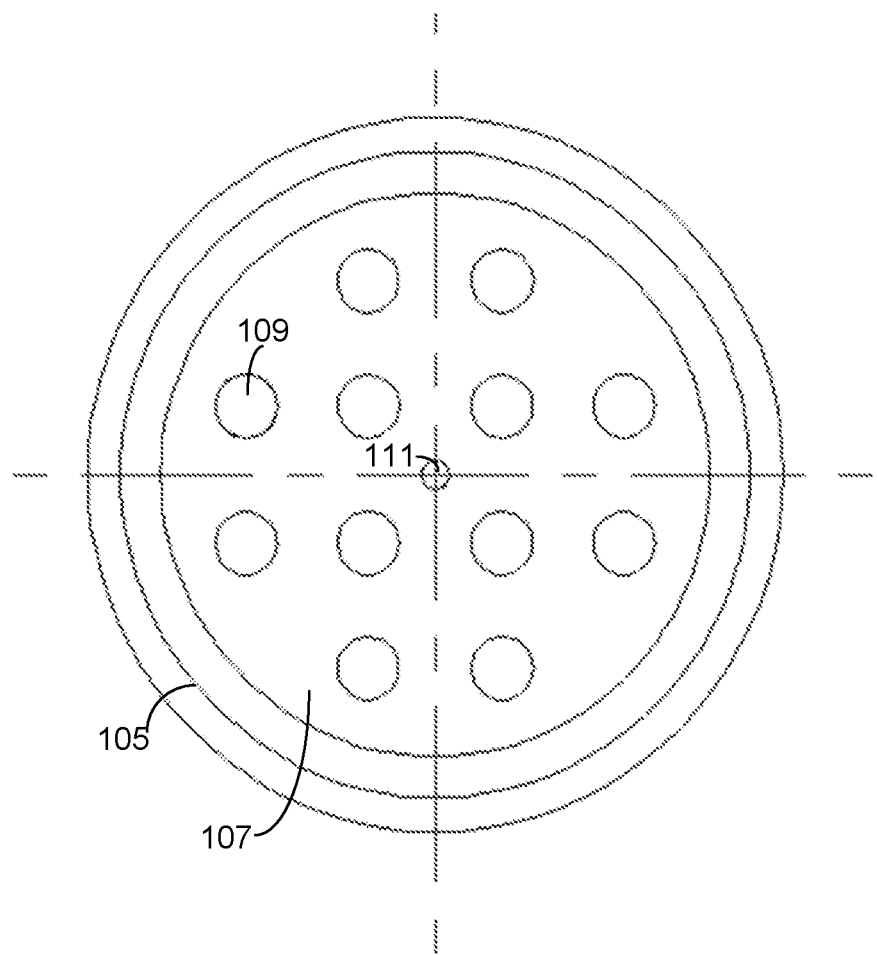
FIG. 1B is a top view of the example apparatus shown in FIG. 1A.

FIGS. 1A-B illustrate an example apparatus 100 for preparing a protective coating in accordance with the present disclosure. The apparatus 100 comprises a movable substrate 101 and a reaction chamber 103. The apparatus 100 comprises a set of electrodes 105 positioned inside the reaction chamber to facilitate plasma discharge during the coating process. For example, as shown in FIG. 1A, electrodes 105 are positioned substantially parallel to the walls of the reaction chamber 103 and substantially perpendicular to the movable substrate 101. The movable substrate is positioned within a cavity formed by the electrodes 105. In some embodiments, the movable substrate 101 is provided with a motion mechanism (e.g., a motor) to allow movement of the substrate. For example, the reaction chamber can be a rotary chamber, and the substrate 101 can be driven by a motor (not shown) to rotate around a central axis 111 of the rotary chamber. In some embodiments, one or more rotating racks 107 are positioned above the substrate to hold the target objects 109 to be coated.

Figure 2A:
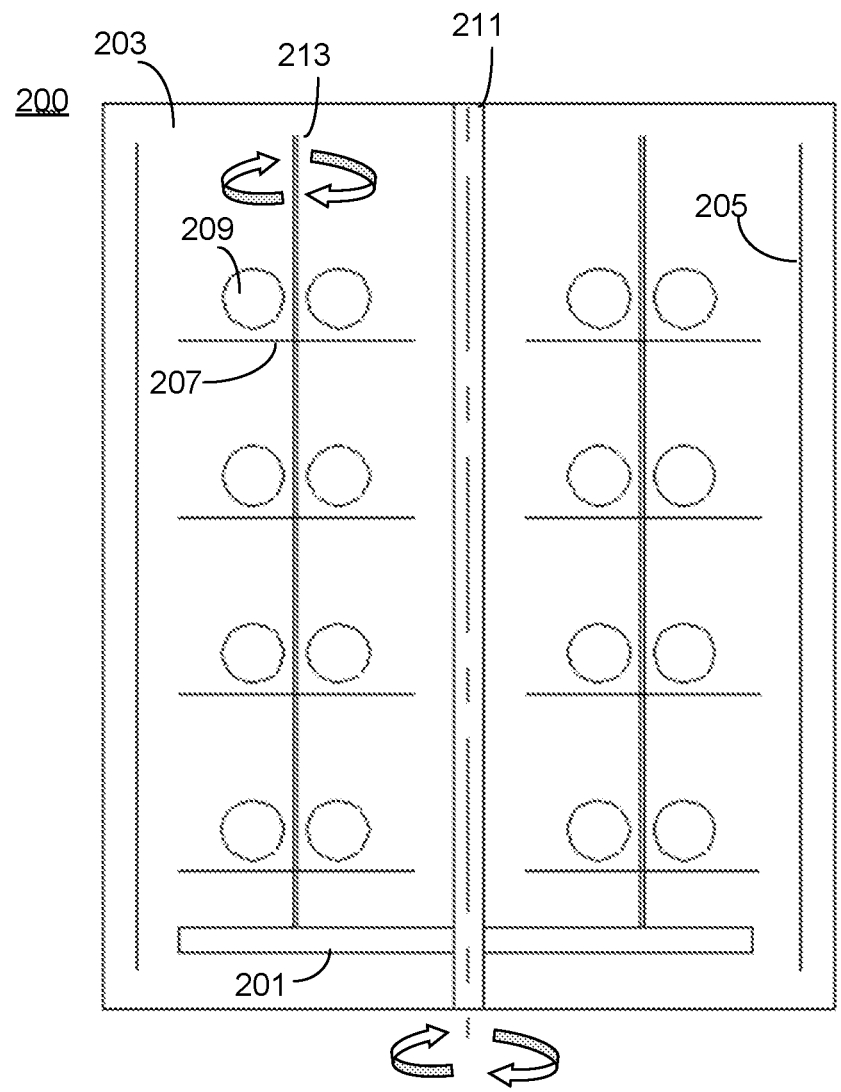
FIG. 2A is a front view of another example apparatus for preparing a protective coating in accordance with the present disclosure.
Figure 2B:
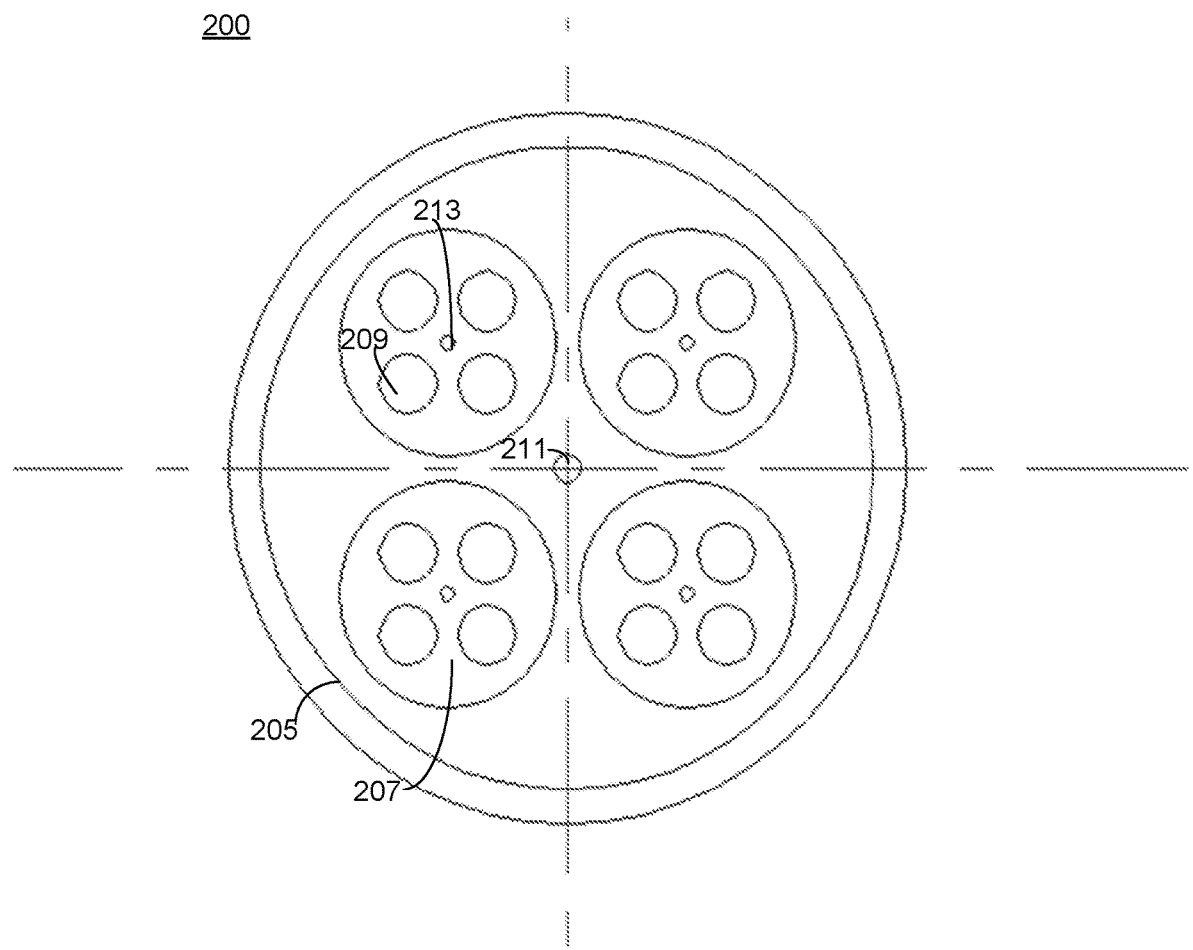
FIG. 2B is a top view of the example apparatus shown in FIG. 2A.

FIGS. 2A-2B illustrate another example apparatus 200 for preparing a protective coating in accordance with the present disclosure. The apparatus 200 comprises a movable substrate 201 and a reaction chamber 203. The apparatus 200 comprises a set of electrodes 205 positioned inside the reaction chamber to facilitate plasma discharge during the coating process. For example, as shown in FIG. 2A, electrodes 205 are positioned substantially parallel to the walls of the reaction chamber 203 and substantially perpendicular to the movable substrate 201. The movable substrate is positioned within a cavity formed by the electrodes 105. In some embodiments, the movable substrate 201 is provided with a motion mechanism (e.g., a motor) to allow movement of the substrate. For example, the reaction chamber can be a rotary chamber, and the substrate 201 can be driven by a motor (not shown) to rotate around a central axis 211 of the rotary chamber. In some embodiments, one or more rotating trays/racks 207 are positioned above the substrate to hold the target objects 209 to be coated. The one or more rotating racks 207 can be coupled to one or more motion mechanisms. In some embodiments, the one or more rotating racks 207 are coupled to the same motion mechanism (e.g., a motor) to allow uniform movement of all the racks. In some embodiments, each rack 207 is coupled to a different motion mechanism to allow independent movement. For example, as shown in FIG. 2A, the racks 207 can rotate around a second rotation axis 213 while the substrate is configured to rotate around a central axis 211 of the reaction chamber 203, thereby forming a planetary motion for the target objects 209.

Figure 3A:
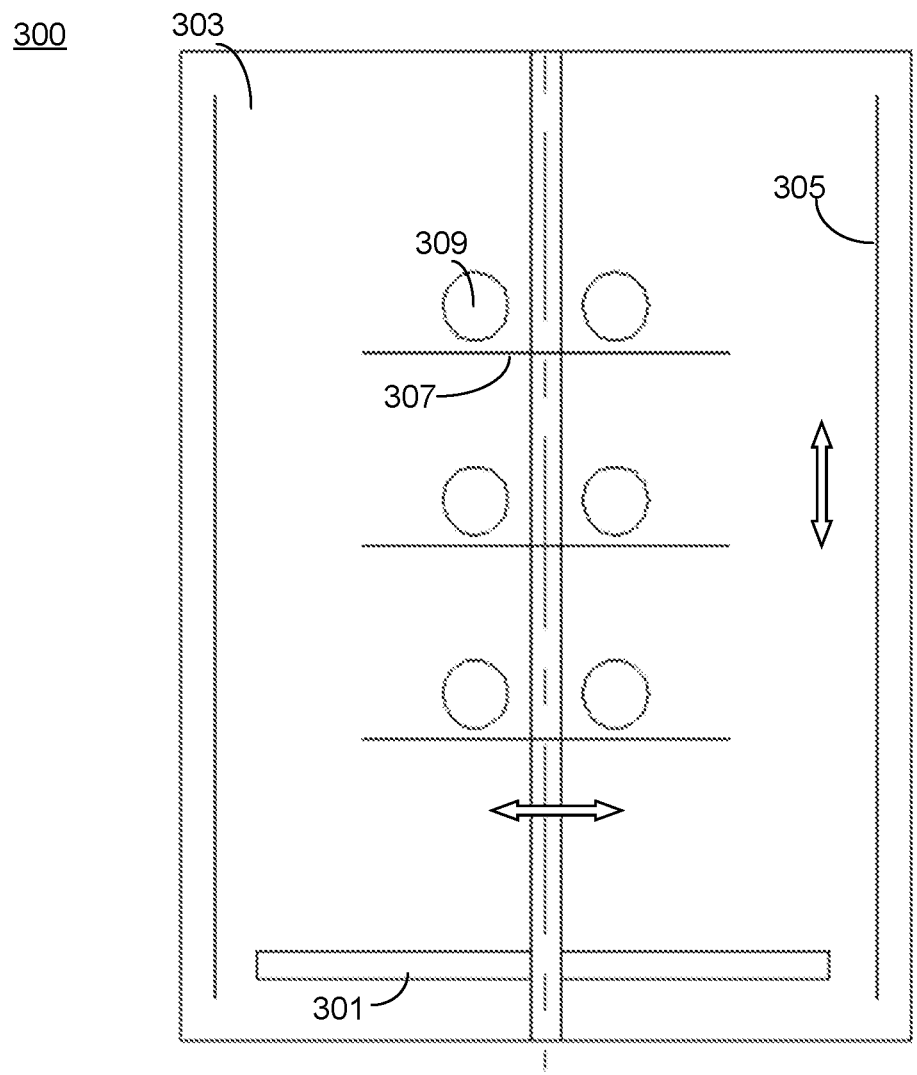
FIG. 3A is a front view of another example apparatus for preparing a protective coating in accordance with the present disclosure.
Figure 3B:
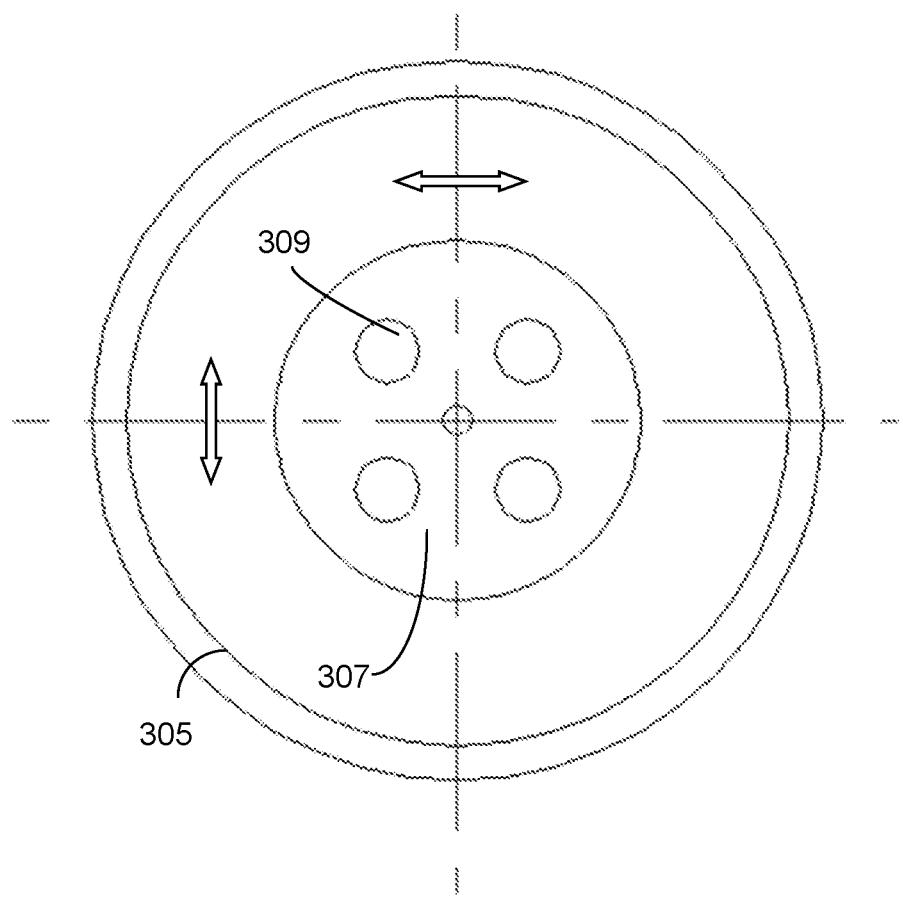
FIG. 3B is a top view of the example apparatus shown in FIG. 3A.

FIGS. 3A-3B illustrate another example apparatus 300 for preparing a protective coating in accordance with the present disclosure. The apparatus 300 comprises a movable substrate 301 and a reaction chamber 303. The apparatus 300 comprises a set of electrodes 305 positioned inside the reaction chamber to facilitate plasma discharge during the coating process. For example, as shown in FIG. 3A, electrodes 305 are positioned substantially parallel to the walls of the reaction chamber 303 and substantially perpendicular to the movable substrate 301. The movable substrate 301 is positioned within a cavity formed by the electrodes 305. In some embodiments, the movable substrate 301 is provided with a motion mechanism (e.g., a motor) to allow movement of the substrate. In some embodiments, one or more trays/racks 307 are positioned above the substrate to hold the target objects 309 to be coated. The one or more rotating trays/racks 307 can be coupled to one or more motion mechanisms. For example, the motion mechanism can cause a motion in a linear manner, either horizontally or vertically, thereby providing a reciprocating motion (that is, a repetitive up-and-down or back-and-forth linear motion). In some embodiments, the one or more rotating trays/racks 307 are coupled to the same motion mechanism (e.g., a motor) to allow uniform movement of all the racks. In some embodiments, each tray/rack 307 is coupled to a different motion mechanism to allow independent movement.

Figure 4A:
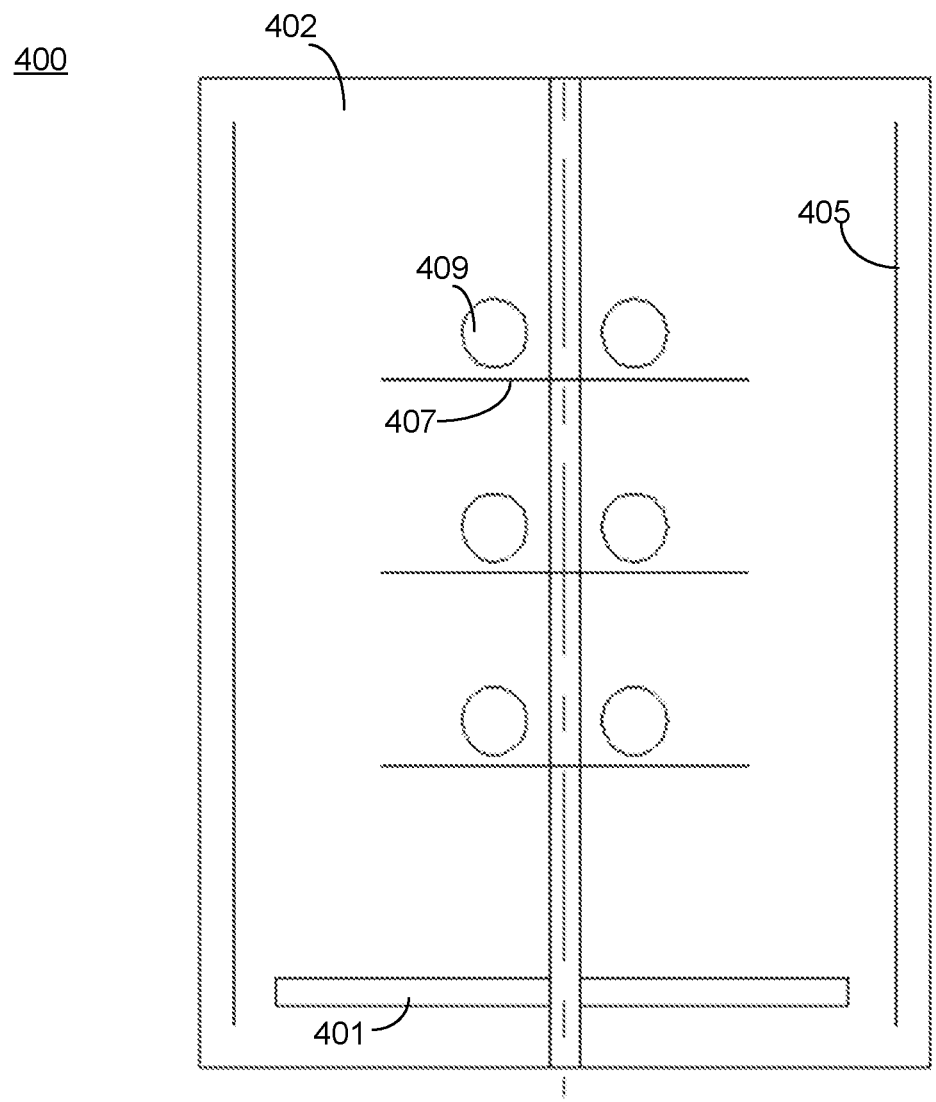
FIG. 4A is a front view of yet another example apparatus for preparing a protective coating in accordance with the present disclosure.
Figure 4B:
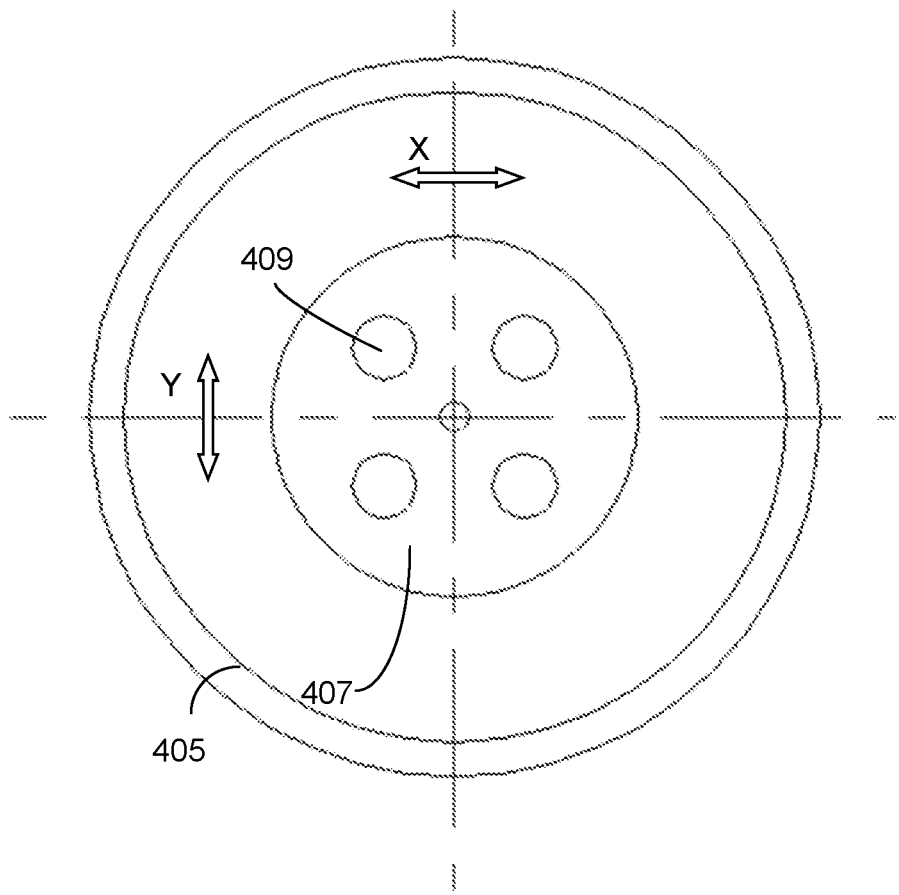
FIG. 4B is a top view of the example apparatus shown in FIG. 4A.

FIGS. 4A-4B illustrate another example apparatus 400 for preparing a protective coating in accordance with the present disclosure. The apparatus 400 comprises a movable substrate 401 and a reaction chamber 403. The apparatus 400 comprises a set of electrodes 405 positioned inside the reaction chamber to facilitate plasma discharge during the coating process. For example, as shown in FIG. 4A, electrodes 405 are positioned substantially parallel to the walls of the reaction chamber 403 and substantially perpendicular to the movable substrate 401. The movable substrate 401 is positioned within a cavity formed by the electrodes 405. In some embodiments, as shown in FIG. 4B, the movable substrate 401 is provided with a motion mechanism (e.g., a motor) to allow movement of the substrate. For example, the motion mechanism can cause a motion in a linear manner, either X direction or Y direction across the horizontal plane, thereby providing a planar reciprocating motion (that is, a repetitive back-and-forth motion in a plane). In some embodiments, one or more trays/racks 407 are positioned above the substrate to hold the target objects 409 to be coated. The one or more rotating trays/racks 307 can be coupled to one or more motion mechanisms. In some embodiments, the one or more rotating trays/racks 407 are coupled to the same motion mechanism (e.g., a motor) to allow uniform movement of all the racks. In some embodiments, each tray/rack 407 is coupled to a different motion mechanism to allow independent movement.

In some embodiments, a vacuum exhausting device, such as an air pumping-type vacuum exhausting device, is connected to the reaction chamber 403 to create a vacuum environment. The vacuum exhausting device can include an exhaust pipe, a first stage vacuum pump, and a second stage vacuum pump. The exhaust pipe connects the reaction chamber 403 with the second stage vacuum pump, and then the first stage vacuum pump. In some embodiments, a gas pipeline is also connected to the reaction chamber to provide inflows of a carrier gas and/or a monomer vapor.

Figure 5:
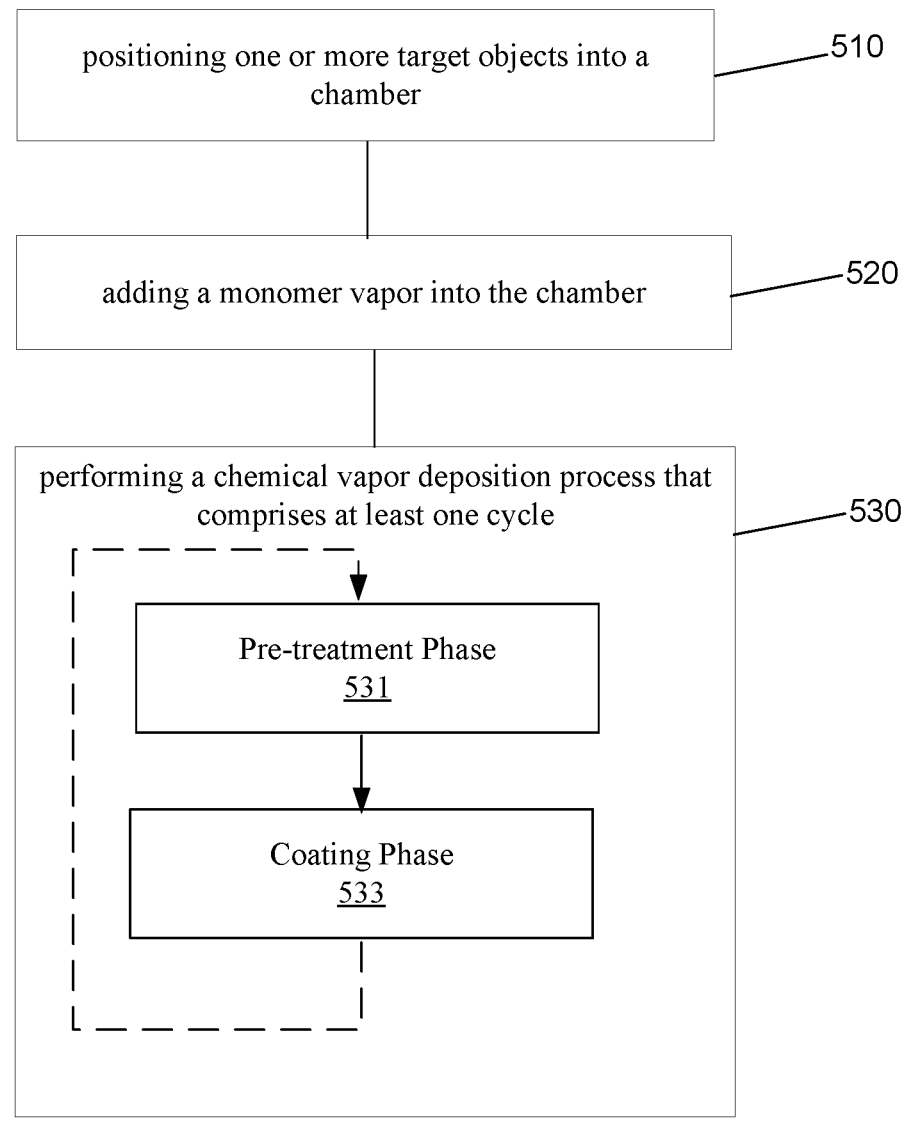
FIG. 5 is a flowchart representation of a method for preparing a multi-functional protective coating in accordance with the present disclosure.

FIG. 5 is a flowchart representation of a method 500 for preparing a multi-functional protective coating in accordance with the present disclosure. The method 500 includes, at operation 510, positioning one or more target objects into a chamber. The chamber comprises a movable substrate and one or more trays coupled to the movable substrate to hold the one or more target objects such that the one or more target objects are movable within the chamber. The method 500 includes, at operation 520, adding a monomer vapor into the chamber. The method 500 includes, at operation 530, performing a chemical vapor deposition process using discharges such that the monomer vapor forms a protective coating on surfaces of the one or more target objects. The chemical vapor deposition process comprises at least one cycle that comprises a pretreatment phase 531 and a coating phase 533. A first type of discharge is applied at a first power level for a first time duration in the pretreatment phase, and a second type of discharge is applied at a second power level for a second time duration in the coating phase. The second power level is lower than the first power level.

As shown in FIG. 5, the chemical vapor deposition process comprises one or more cycles. Each cycle comprises the pretreatment phase and the coating phase. The cycles may be repeated in the chemical vapor deposition process to create a multi-layer protective coating. In some embodiments, the method includes applying different types of discharges at different power levels for different time durations for different cycles so that the layers of the protective coating have different thickness and/or density.

In some embodiments, the discharges comprise a radio frequency discharge, a microwave discharge, an intermediate frequency discharge, a high frequency discharge, or a spark discharge. In some embodiments, the first type of discharge comprises a continuous discharge. The chemical vapor deposition process comprises applying the continuous discharge at a power level in a range of 120 to 400 W and for a time duration between 60 to 900 seconds in the pretreatment phase. In some embodiments, the second type of discharge comprises a continuous discharge. In some embodiments, the second type of discharge comprises a pulse discharge that has a duty cycle between 1/800 and 1. In some embodiments, the pulse discharge is applied at a pulse frequency between 1 to 100 Hz. In some embodiments, the second type of discharge comprises a periodic alternating discharge. In some embodiments, the periodic alternating discharge is applied at an alternating frequency is between 1 to 1000 Hz. In some embodiments, the chemical vapor deposition process comprises applying the second type of discharge at a power level in a range of 10 to 250 W and for a time duration between 600 to 7200 seconds.

In some embodiments, the method further includes reducing, after positioning the one or more target objects into the chamber, a pressure in the chamber to reach between 10 to 200 millitorr. In some embodiments, the method includes adding an inert gas into the chamber prior to adding the monomer vapor. In some embodiments, the inert gas includes Argon or Helium. In some embodiments, the monomer vapor includes a mixture of two monofunctional unsaturated fluorocarbon resins and two polyfunctional unsaturated hydrocarbon derivatives.

In some embodiments, the method includes applying a motion to the movable substrate to drive a movement of the one or more target objects. The motion comprises a circular motion, a planetary motion, a linear reciprocating motion, or a curvilinear reciprocating motion relative to the chamber.

Figure 6:
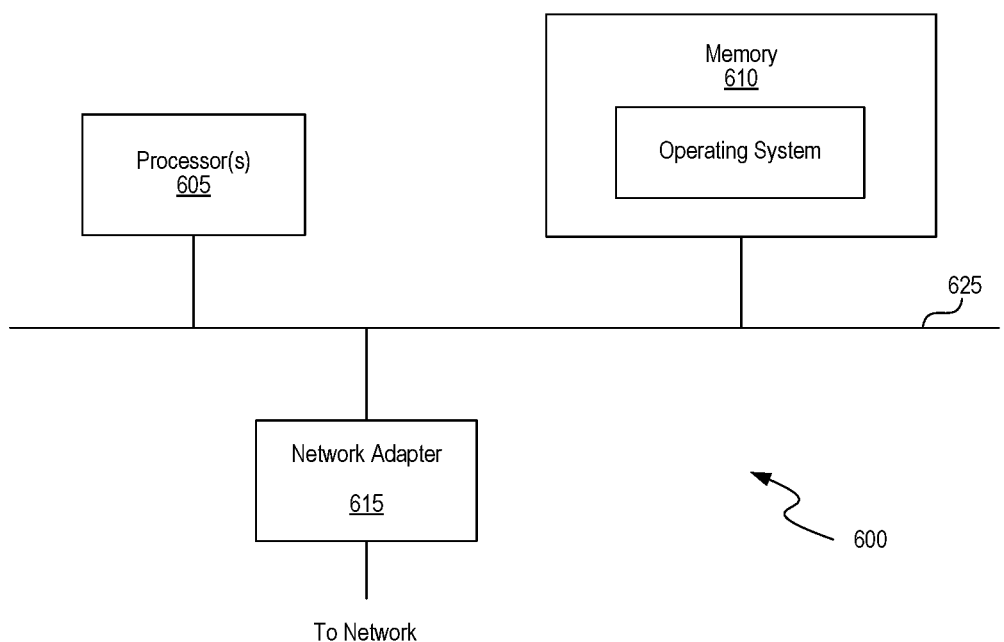
FIG. 6 is a block diagram illustrating an example of the architecture for a controller that can be used to implement various portions of the presently disclosed technology.

FIG. 6 is a block diagram illustrating an example of the architecture for a controller 600 that can be used to implement various portions of the presently disclosed technology. In FIG. 6, the controller 600 includes one or more processors 605 and memory 610 connected via an interconnect 625. The interconnect 625 may represent any one or more separate physical buses, point to point connections, or both, connected by appropriate bridges, adapters, or controllers. The interconnect 625, therefore, may include, for example, a system bus, a Peripheral Component Interconnect (PCI) bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 674 bus, sometimes referred to as "Firewire."

The processor(s) 605 may include central processing units (CPUs) to control the overall operation of, for example, the host computer. The processor(s) 605 can also include one or more graphics processing units (GPUs). In certain embodiments, the processor(s) 605 accomplish this by executing software or firmware stored in memory 610. The processor(s) 605 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

The memory 610 can be or include the main memory of the computer system. The memory 610 represents any suitable form of random access memory (RAM), read-only memory (ROM), flash memory, or the like, or a combination of such devices. In use, the memory 610 may contain, among other things, a set of machine instructions which, upon execution by processor 605, causes the processor 605 to perform operations to implement embodiments of the presently disclosed technology.

Also connected to the processor(s) 605 through the interconnect 625 is a (optional) network adapter 615. The network adapter 615 provides the computer system 600 with the ability to communicate with remote devices, such as the storage clients, and/or other storage servers, and may be, for example, an Ethernet adapter or Fiber Channel adapter.

The memory 610 as shown in FIG. 6 includes processor executable code. The processor executable code upon execution by the processor configures the processor to control one or more electrodes (e.g., as shown in FIGS. 1A-4B) during a chemical vapor deposition process. The chemical vapor deposition process comprises multiple cycles, each cycle comprising a pretreatment phase and a coating phase. The one or more electrodes are configured by the processor to, for each cycle, apply a first type of discharge at a first power level for a first time duration in the pretreatment phase, and apply a second type of discharge at a second power level for a second time duration in the coating phase, wherein the second power level is lower than the first power level. The processor is further configured to adjust types of discharges, power levels of the discharges, or time durations of the discharges for different cycles in the chemical vapor deposition process.

Figure 7:
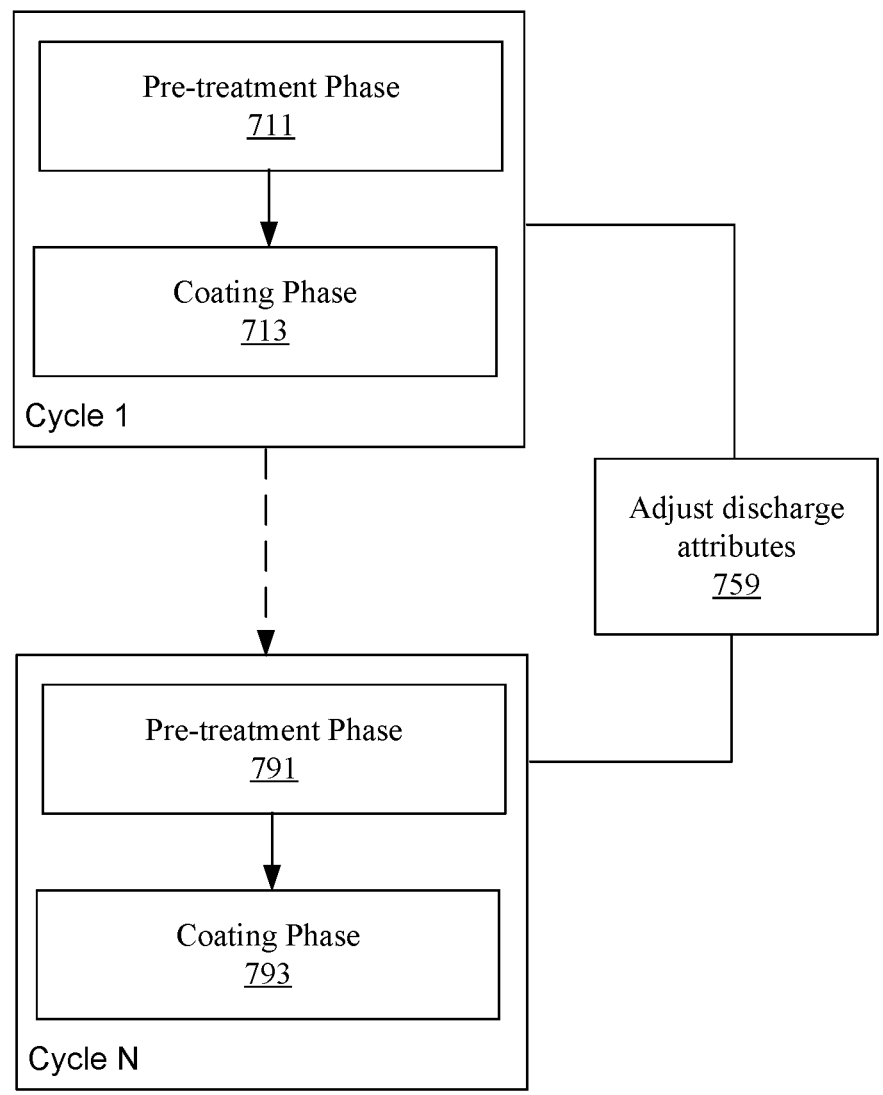
FIG. 7 is a flowchart representation of a method for controlling a protective coating process in accordance with the present disclosure.

FIG. 7 is a flowchart representation of a method 700 for controlling a protective coating process in accordance with the present disclosure. The protective coating process uses chemical vapor deposition process that comprises multiple cycles: Cycle 1, Cycle 2, . . . Cycle N. Each of the cycle includes a pretreatment phase and a coating phase. For example, Cycle 1 includes a pre-treatment phase 711 and a coating phase 713. Cycle N includes a pre-treatment phase 791 and a coating phase 793. In each cycle, a first type of discharge is applied at a first power level for a first time duration, while a second type of discharge is applied at a second power level for a second time duration in the coating phase. In general, the second power level is lower than the first power level to avoid any damage to the molecular structure of the coating materials.

The method 700 comprises, at operation 759, adjusting various attributes of the discharges for different cycles to achieve a complex structure for a multi-layer protective coating. The attributes include but are not limited to discharge types, power levels, and/or discharge durations. For example, higher power levels can result in dense layers while lower power levels can result in loose layers. A combination of different discharge types, power levels, and/or discharge time durations can result in complex multi-layer coatings that are suitable for different protection requirements. In one specific example, the chemical vapor deposition process comprises three cycles. In the first cycle, a high power level (e.g., 400 W) is applied in the pretreatment phase. A periodic alternating discharge is then applied in the coating phase to form a compact cross-linked first layer. In the second cycle, the power level for the pretreatment phase is adjusted (e.g., from 400 W to 300 W) to account for the surface characteristics of the first layer. In the coating phase, a high duty ratio pulse discharge is applied to achieve a thicker cross-linked second layer (e.g., with a longer discharge time duration). Subsequently in the third cycle, the power level for the pretreatment phase remains the same (e.g., 300 W). A continuous discharge at a lower power level is then applied in the coating phase to form a loose top layer to achieve better functional properties.

Figure 8:
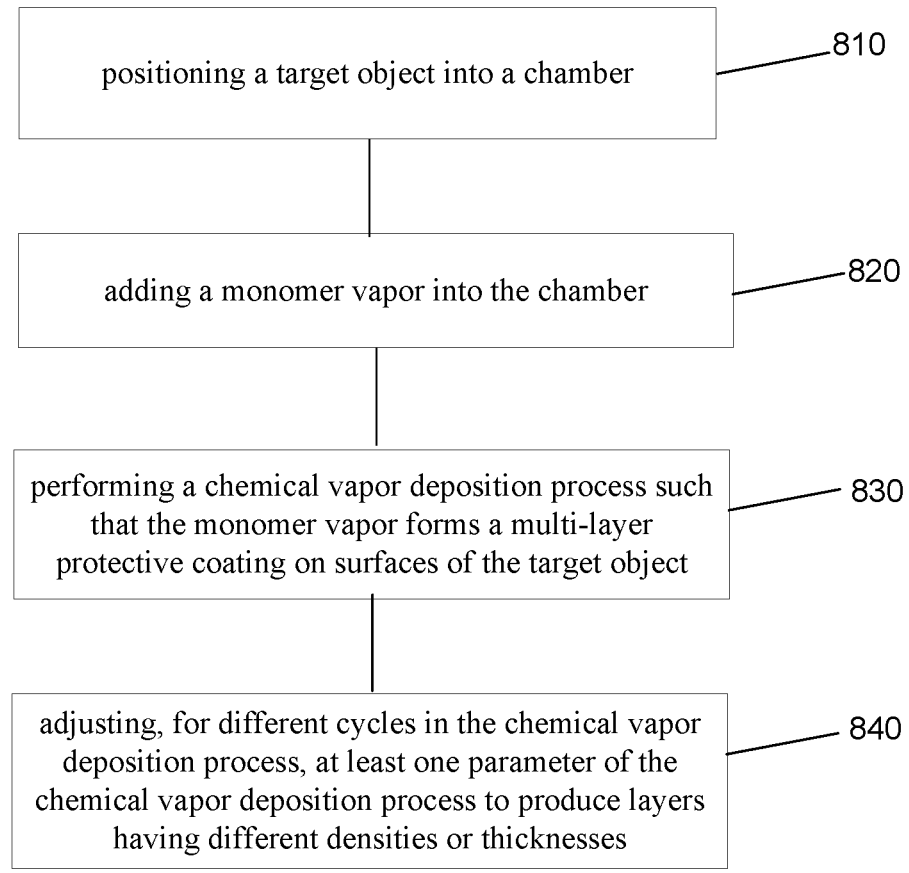
FIG. 8 is a flowchart representation of another method for controlling a protective coating process in accordance with the present disclosure.

FIG. 8 is a flowchart representation of a method 800 for controlling a protective coating process in accordance with the present disclosure. The method 800 includes, at operation 810, positioning a target object into a chamber. The method 800 includes, at operation 820, adding a monomer vapor into the chamber. The method 800 also includes, at operation 830, performing a chemical vapor deposition process such that the monomer vapor forms a multi-layer protective coating on surfaces of the target object. The chemical vapor deposition process comprises multiple cycles, each cycle comprising a pretreatment phase and a coating phase to prepare a layer of the multi-layer coating. In the pretreatment phase, a first type of a discharge is applied at a first power level for a first time. In the coating phase, a second type of a discharge is applied at a second power level for a second time duration, the second power level being lower than the first power level. The method 800 also includes, at operation 840, adjusting, for different cycles in the chemical vapor deposition process, at least one parameter of the chemical vapor deposition process to produce layers having different densities or thicknesses. The at least one parameter includes the first type of discharge, the second type of discharge, the first power level, the second power level, the first time duration, or the second time durations.

In some embodiments, the discharge applied in the chemical vapor deposition process comprises a radio frequency discharge, a microwave discharge, an intermediate frequency discharge, a high frequency discharge, or a spark discharge. In some embodiments, the first type of discharge comprises a continuous discharge, the first power level is in a range of 120 to 400 W, and the first time duration is between 600 to 7200 seconds. In some embodiments, the second type of discharge comprise a continuous discharge, a pulse discharge, or a periodic alternating discharge. In some embodiments, the second power level is in a range of 10 to 250 W. In some embodiments, the second time duration is between 600 to 7200 seconds. In some embodiments, at least one of the second type of discharge or the second power level is adjusted to produce layers having decreasing densities. In some embodiments, the second time duration is adjusted to produce layers having a uniform thickness.

In some embodiments, the first power level in the pretreatment phase in each cycle is adjusted based on a surface characteristic of the target object or a previous layer of the multi-layer coating. In some embodiments, the target object comprises at least a sensor, a circuit board, a mobile phone, a display screen, or a hearing aid.

In another example aspect, an apparatus for preparing a protective coating comprises a chamber, a substrate positioned within the chamber configured to hold at least a target object, an inlet pipe configured to direct a monomer vapor into the chamber, and one or more electrodes configured to perform a chemical vapor deposition process to produce a multi-layer coating. The chemical vapor deposition process comprises multiple cycles, each cycle comprising a pretreatment phase and a coating phase to produce a layer of the multi-layer coating. The one or more electrodes are configured to, for a first cycle of the multiple cycles, apply, in the pretreatment phase, a first type of a discharge at a first power level for a first time duration, and apply, in the coating phase, a second type of a discharge at a second power level for a second time duration to produce a first layer of coating having a first density, the second power level being lower than the first power level. The one or more electrodes are further configured to adjust at least one of the second type of the discharge or the second power level in a second cycle of the multiple cycles to produce a second layer having a different density.

In some embodiments, the one or more electrodes are further configured to adjust the second time duration in a third cycle of the multiple cycles to produce a third layer having a different thickness. In some embodiments, the one or more electrodes are configured to adjust the first power level in the pretreatment phase in each cycle based on a surface characteristic of the target object or a previous layer of the multi-layer coating. In some embodiments, the one or more electrodes are configured to adjust, based on a protection requirement, at least one of the first type of discharge, the second type of discharge, the first power level, the second power level, the first time duration, or the second time durations. The protection requirement includes at least one of water-resistance, moisture-resistance, fugus-resistance, thermal-resistance, or corrosion-resistance.

In some embodiments, the discharge applied in the chemical deposition process comprises a radio frequency discharge, a microwave discharge, an intermediate frequency discharge, a high frequency discharge, or a spark discharge. In some embodiments, the first type of discharge comprises a continuous discharge, and wherein the first type of discharge is applied at a power level in a range of 120 to 400 W and for a time duration between 60 to 900 seconds in the pretreatment phase. In some embodiments, the second type of discharge comprises a continuous discharge. In some embodiments, the second type of discharge comprises a pulse discharge that has a duty cycle between $1/800$ and 1, wherein the pulse discharge is applied at a pulse frequency between 1 to 100 Hz. In some embodiments, the second discharge includes a periodic alternating discharge applied at an alternating frequency is between 1 to 1000 Hz.

In some embodiments, the apparatus further comprises an exhaust pipe configured to reduce a pressure in the chamber at between 10 to 200 millitorr. In some embodiments, the apparatus comprises a second inlet pipe configured to direct an inert gas into the chamber. In some embodiments, the monomer vapor includes a mixture of two monofunctional unsaturated fluorocarbon resins and two polyfunctional unsaturated hydrocarbon derivatives. In some embodiments, the target object comprises at least a sensor, a circuit board, a mobile phone, a display screen, or a hearing aid.

In another example aspect, an apparatus for controlling a protective coating process comprises a processor, and a memory including processor executable code. The processor executable code upon execution by the processor configures the processor to control one or more electrodes during a chemical vapor deposition process to produce a multi-layer coating on a target object. The chemical vapor deposition process comprising multiple cycles, each cycle comprising a pretreatment phase and a coating phase to produce a layer of the multi-layer coating. The processor is configured to control the one or more electrodes to, for each cycle: apply a first type of a discharge at a first power level for a first time duration in the pretreatment phase, and apply a second type of a discharge at a second power level for a second time duration in the coating phase. The second power level is lower than the first power level. The processor is further configured to control the one or more electrodes to adjust, for different cycles in the chemical vapor deposition process, at least one of: the first type of discharge, the second type of discharge, the first power level, the second power level, the first time duration, or the second time durations.

In some embodiments, the discharge applied in the chemical vapor deposition process comprises a radio frequency discharge, a microwave discharge, an intermediate frequency discharge, a high frequency discharge, or a spark discharge. In some embodiments, the first type of discharge comprises a continuous discharge, the first power level is in a range of 120 to 400 W, and the first time duration is between 600 to 7200 seconds. In some embodiments, the second type of discharge comprise a continuous discharge, a pulse discharge, or a periodic alternating discharge. In some embodiments, the second power level is in a range of 10 to 250 W. In some embodiments, the second time duration is between 600 to 7200 seconds.

In some embodiments, the processor is configured to control the one or more electrodes to adjust the first power level in the pretreatment phase in each cycle based on a surface characteristic of the target object or a previous layer of the multi-layer coating.

In yet another example aspect, an apparatus for preparing a protective coating comprises a chamber and a movable substrate positioned within the chamber. The movable substrate coupled to one or more trays configured to hold at least a target object. The apparatus also includes an inlet pipe configured to direct a monomer vapor into the chamber and one or more electrodes configured to perform a chemical vapor deposition process. The chemical vapor deposition process comprises at least one cycle, the at least one cycle comprising a pretreatment phase and a coating phase. In the pretreatment phase, a first type of a discharge is applied at a first power level for a first time duration. In the coating phase, a second type of a discharge is applied at a second power level for a second time duration, the second power level being lower than the first power level.

In some embodiments, the chemical vapor deposition process comprises multiple cycles, wherein each cycle comprises the pretreatment phase and the coating phase. In some embodiments, different types of discharges are applied at different power levels for different time durations for different cycles.

In some embodiments, the discharge applied in the chemical deposition process comprises a radio frequency discharge, a microwave discharge, an intermediate frequency discharge, a high frequency discharge, or a spark discharge.

In some embodiments, the first type of discharge comprises a continuous discharge, and wherein the first type of discharge is applied at a power level in a range of 120 to 400 W and for a time duration between 60 to 900 seconds in the pretreatment phase. In some embodiments, the second type of discharge comprises a continuous discharge. In some embodiments, the second type of discharge comprises a pulse discharge that has a duty cycle between 1/800 and 1. In some embodiments, the pulse discharge is applied at a pulse frequency between 1 to 100 Hz. In some embodiments, the second discharge includes a periodic alternating discharge. In some embodiments, the periodic alternating discharge is applied at an alternating frequency is between 1 to 1000 Hz. In some embodiments, the second type of discharge is applied at a power level in a range of 10 to 250 W and for a time duration between 600 to 7200 seconds.

In some embodiments, the apparatus includes an exhaust pipe configured to reduce a pressure in the chamber at between 10 to 200 millitorr. In some embodiments, the apparatus includes a second inlet pipe configured to direct an inert gas into the chamber. In some embodiments, the inert gas includes Argon or Helium. In some embodiments, the monomer vapor includes a mixture of two monofunctional unsaturated fluorocarbon resins and two polyfunctional unsaturated hydrocarbon derivatives. In some embodiments, the apparatus includes a motor configured the movable substrate to apply a motion to the target object via the movable substrate, wherein the motion comprises a circular motion, a planetary motion, a linear reciprocating motion, or a curvilinear reciprocating motion relative to the chamber.

As irreversible damages can thus occur to the target objects (e.g., electronic devices), the coating techniques disclosed here can improve the production efficiency and increase the service life of the coating in a corrosive environment, thereby achieving better protective effects on products. Some example applications of the coating are described as follows.

(1) Portable equipment keyboards. Portable keyboards are small and light, and are often used on computers, mobile phones and other devices. They can facilitate users to work during trips. However, when they are contaminated by common liquids, such as water from accidently tipped cups and soaking by rain water or sweat, the inside of a keyboard can be easily short circuited and broken down. When this protective coating is applied to a keyboard, it can ensure that the keyboard surface is easy for cleaning. The keyboard can remain intact when exposed to water and can adapt to various environments.

(2) LED display screens: LED display screens are used for commodity advertisement, store decoration, illumination, warning and other purposes. Occasionally, the LED display screens may be exposed to rain water, heavy dust or other severe environments. For example, when it rains, outdoor LED display screens, such as the displays in shopping malls, warning lights on roads, and LED display control panels in workshops, tend to fail. Moreover, dust can easily accumulate on LED display screens—some of them are not easy to clean. Applying the protective coating to such LED display screens can solve these issues effectively.

(3) Intelligent fingerprint lock. An intelligent fingerprint lock can combine computer information technologies, electronic technologies, mechanical technologies and modern hardware technologies, and is widely applied to police criminal investigation and judicial fields. However, when exposed to water, the lock's internal circuit tends to be short circuited, leading to a total replacement of the lock. Applying the coating to the lock can effectively avoid such issue.

(4) Hearing aid and Bluetooth earphone. Currently, hearing aids and Bluetooth earphones do not have communication lines. After adopting this coating, users can use or even immerse these devices in a water, such as showers and rainy days, for a brief amount of time without damaging the devices.

(5) Sensors. Some sensors, such as water pressure, oil pressure sensors or sensors in underwater equipment, are exposed in a liquid environment. After such sensors are provided with the coating, their internal structures can be protected against the external environment.

(6) The majority of 3C product, such as mobile phones, notebook computers, PSP, and so on.

(7) Other devices that need to be waterproof, including devices that operate in a wet environment, or may encounter unforeseen circumstances, such as spills by common liquids.

The prepared coating is characterized by the properties of resistance to water, moisture, fungus, acid and alkaline solvents, acid and alkaline salt sprays, acidic atmosphere, organic solvent immersion, cosmetics, perspiration, thermal cycling impact ($-40°$ C.-+75° C.) and alternating dampness and heat (humidity: 75%-95%). The influence of the coating on radio frequency communication signals should be minimum: typically, the influence is within the range of 10 M-8 G, which is lower than 5% of the signals, when the coating thickness is 1-1000 nm. The multi-functional protective coating prepared using the techniques disclosed herein can also be applied to the following different environments and related products:

Water Resistance, Moisture Resistance and Fungus Resistance (1) Interior decoration of houses: ceiling, wallpaper, ceiling lamp, window curtain and screening in a bathroom.

(2) Articles of daily use: mosquito net, table lamp cover, chopstick holder, and automobile rearview mirror.

(3) Cultural relics and works of art: copybook for calligraphy, antique, wood carving, leather, bronze ware, silk, ancient costume and ancient book.

(4) Electronic components and electronic products: sensors (working in humid or dusty environments), chips of various electronic products (electronic sphygmomanometers and intelligent watches), circuit boards, mobile phones, LED display screens, hearing aids, and/or USB interface.

(5) Precision instruments and optical devices: mechanical watches and microscopes.

Resistance to Acidic and Alkaline Solvents, Resistance to Acid and Alkaline Salt Sprays, and Resistance to Acidic Atmosphere:

(1) Interior trim parts of houses: wallpaper and ceramic tiles.

(2) Protective appliance: Acid (alkali) proof gloves and acid (alkali) proof protective clothing.

(3) Mechanical equipment and pipelines: flue gas desulfurization equipment, sealing elements (acid/alkaline lubricating oil), pipelines, valves, and lining of large diameter marine conveying pipelines.

(4) Various reaction kettles and reactors.

(5) Production and storage of chemicals, sewage treatment and aeration tanks.

(6) Others: acid and alkali workshops, anti-alkali aerospace, energy and power, ferrous metallurgy, petro-chemical, medical treatment and other industries, storage containers, statues (to mitigate corrosion by acid rain), and sensors (in acidic/alkaline environments).

Resistance to Organic Solvent Immersion, Cosmetic Resistance, and Perspiration Resistance:

(1) Alkane, alkene, alcohol, aldehyde, amine, ester, ether, ketone, aromatic hydrocarbon, hydrogenated hydrocarbon, terpene hydrocarbon, halohydrocarbon, heterocyclic compound, nitrogen containing compound and sulfocompound solvents;

(2) Cosmetic packaging containers;

(3) Fingerprint locks and earphones.

(4) Resistance to thermal cycling impact ($-40°$ C.$-+75°$ C.), resistance to alternating dampness and heat (humidity: 75%-95%):

(5) Electrical engineering, electronic and automotive electrical appliances, such as devices in fields of aerospace, auto, home appliances and scientific research.

Additional details regarding adjusting discharge types, power levels, and/or discharge durations for different cycles are further described in various embodiments below.

Embodiment 1

A method for preparing a multi-functional protective coating through low power continuous discharge can be implemented as follows. The plasma discharge mode can be continuous radio frequency discharge. The method can include the following operations:

(1) A target object is positioned into a reaction chamber of protective coating preparation equipment. The reaction chamber is then closed and vacuumed continuously until the vacuum degree in the reaction chamber is 10 millitorr. An inert gas (e.g., Ar) is then introduced into the reaction chamber. The target object can start moving in the reaction chamber using a movement mechanism. The target object can hold a solid material. For example, the solid material can be a block of a Teflon plate. The solid material can also include an electric appliance part. When the target object surfaces are provided with the coating, they can be exposed to the fungus test environment under GJB150.10A-2009. When the surfaces of the electric appliance part are provided with the coating, they can be exposed to the environment described in the International Industrial Waterproof Rating IPX7.

In some embodiments, the volume of the reaction chamber can be 50 L, the temperature in the reaction chamber can be controlled at 30° C., and the incoming flow of the inert gas can be 5 sccm. In some embodiments, as the target object moves in the reaction chamber, the movement forms a circular motion relative to the reaction chamber. The speed of the circular movement can be 1 r/min.

(2) A monomer vapor is then introduced into the reaction chamber until the vacuum degree reaches 30 millitorr, thereby enabling the plasma discharge and the chemical vapor deposition.

(3) The deposition process includes pretreatment and coating phases. In the pretreatment phase, the plasma discharge power can be around 120 W, and the time can be around 900 s. Subsequently in the coating phase, the plasma discharge power is adjusted to around 10 W and the time is adjusted to around 7200 s.

In some embodiments, cyclic repetition of the deposition process is used. In the pretreatment phase, the plasma discharge power can be around 400 W, and the time can be around 60 s. Subsequently in the coating phase, the plasma discharge power is adjusted to around 75 W, and the time is adjusted to around 600 s. The pretreatment and coating phases can be repeated for 5 to 15 times to prepare a protective coating through chemical vapor deposition on the target object surfaces. In one embodiment, the pretreatment and coating phases can be repeated for eleven times.

The discharge power and/or the discharge time in the pretreatment and coating phases can vary for each repetition to achieve the desired multi-layer coating structure. In one example, the discharge power in the pretreatment phase remains the same (e.g., 400 W) for all the cycles. The discharge power in the coating phase is gradually reduced (e.g., from 75 W to 10 W) in each cycle to form denser base layers and looser top layers. The discharge time can be changed accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 1000 μL/min. In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 15-30%. The monofunctional unsaturated fluorocarbon resins can include 2-perfluoro octyl ethyl acrylate and 2-(perfluorohexyl) ethyl methacrylate. The polyfunctional unsaturated hydrocarbon derivatives include diacrylic gylcol ester and 1,6-hexanediol diacrylate.

(4) When the coating is completed, the introduction of the monomer vapor is stopped. The plasma discharge is stopped as well. The reaction chamber is vacuumed continuously (e.g., for about 1 minute) to reduce the vacuum degree of reaction chamber to 10 millitorr. Regular air is then introduced to the chamber to bring the pressure back to one barometric pressure. The target object then can be removed from the chamber.

Table 1 shows an example set of performance test results for the Teflon plate.

| | Teflon plate-performance test | | | | |
|---|---|---|---|---|---|
| Thickness | Water contact angle | Oil contact angle | Adhesion | Fungus resistant grade | Degree of surface fungus spots |
| 356 nm | 135° | 93° | Low adhesion, water droplets easily slipped | Grade 2 | 4% |
| 347 nm | 133° | 98° | | Grade 2 | 4% |
| 351 nm | 133° | 96° | | Grade 2 | 4% |

Table 2 shows another set of performance test results for the Teflon plate.

| | Teflon plate-performance test | | | | |
|---|---|---|---|---|---|
| Performance | Water contact angle | Oil contact angle | Adhesion | Fungus resistant grade | Degree of surface fungus spots |
| Result | 137° | 95° | Low adhesion, water droplets easily slipped | Grade 2 | 7% |

The results of underwater immersion tests under different voltages of the electric appliance part provided with the waterproof coating that is resistant to electric breakdown are shown in Table 3.

| Resistance to underwater energization | | | |
|---|---|---|---|
| | Time for the current to reach 1 mA under a certain voltage | | |
| Thickness | 3.8 V | 5 V | 12.5 V |
| Result 355 nm | >60 h | >48 h | >30 h |

The IPX 7 Waterproof Rating test (1 m underwater for 30 min of immersion) results of the electric appliance part provided with the waterproof coating that is resistant to electric breakdown are shown in Table 4:

| IPX 7 Waterproof Rating test |
|---|
| Result: The electric appliance part works normally |

Embodiment 2

A method for preparing a multi-functional protective coating through low power continuous discharge. The plasma discharge mode can be intermediate frequency continuous discharge, and the waveform of the intermediate frequency discharge can be sinusoidal or bipolar pulses. The method can include the following operations:

(1) A target object is positioned into a reaction chamber of protective coating preparation equipment. The reaction chamber is then closed and vacuumed continuously until the vacuum degree in the reaction chamber is 60 millitorr. An inert gas (e.g., Ar) is then introduced into the reaction chamber. The target object can start moving in the reaction chamber using a movement mechanism. The target object can be a solid material. For example, the solid material can be a block of a Teflon plate. The solid material can also include an electric appliance part. When the target object surfaces are provided with the coating, they can be exposed to the fungus test environment under GJB150.10A-2009. When the surfaces of the electric appliance part are provided with the coating, they can be exposed to the environment described in the International Industrial Waterproof Rating IPX7.

In some embodiments, the volume of the reaction chamber can be 250 L, the temperature in the reaction chamber can be controlled at 40° C., and the incoming flow of the inert gas can be 15 sccm. In some embodiments, as the target object moves in the reaction chamber, the movement forms a planetary motion relative to the reaction chamber. The revolution speed of the planetary motion can be 1 r/min, and the auto rotation speed is between 1.5-2.5 r/min.

(2) A monomer vapor is then introduced into the reaction chamber until the vacuum degree reaches 90 millitorr, thereby enabling the plasma discharge and the chemical vapor deposition.

(3) The deposition process includes pretreatment and coating phases. In the pretreatment phase, the plasma discharge power can be around 200 W, and the time is around 700 s. Subsequently in the coating phase, the discharge power is adjusted to around 30 W, and the time is 6000 s.

In some embodiments, cyclic repetition of the deposition process is used. In the pretreatment phase, the plasma discharge power can be around 120 W, and the time can be around 450 s. Subsequently in the coating phase, the plasma discharge power is adjusted to 15 W, and the time is adjusted to 3600 s. The pretreatment and coating phases are repeated for at least one time to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 120 W to 200 W) to account for different surface properties of the target objects and the formed layers. The discharge power in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 60 millitorr allows the incoming flow of the monomer to be 500-700 µL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 35-45%. The monofunctional unsaturated fluorocarbon resins can include 2-(perfluorodecyl) ethyl methacrylate, 2-(perfluorododecyl) ethyl acrylate, and (perfluoro cyclohexyl) methyl acrylate. The polyfunctional unsaturated hydrocarbon derivatives include tripropylene glycol diacrylate and poly (ethylene glycol) diacrylate.

(4) When the coating is completed, the introduction of the monomer vapor is stopped. The plasma discharge is stopped as well. The reaction chamber is vacuumed continuously (e.g., for about 2 minutes) to reduce the vacuum degree of reaction chamber to 80 millitorr. Regular air is then introduced to the chamber to bring the pressure back to one barometric pressure. The target object then can be removed from the chamber.

Table 5 shows example acid and alkaline test results after a bulk aluminum alloy material is coated.

| Material | Acid/alkali reagents | 48 h | 96 h | 144 h | 192 h |
|---|---|---|---|---|---|
| Aluminum alloy | Acidic salt spray | pass | pass | pass | pass |
| | Neutral salt spray | pass | pass | pass | pass |
| | Alkaline salt spray | pass | pass | pass | pass |
| | 5% Acetic acid solution | pass | pass | pass | pass |
| | 5% NaOH solution | pass | pass | pass | pass |

Table 6 shows example performance test results for the Teflon plate deposited with the fungus resistant coating.

| Teflon plate-performance test | | | | | |
|---|---|---|---|---|---|
| Performance | Water contact angle | Oil contact angle | Adhesion | Fungus resistant grade | Degree of surface fungus spots |
| Result | 136° | 93° | Low adhesion, water droplets easily slipped | Grade 2 | 6% |

Table 7 shows example results of underwater immersion tests under different voltages of the electric appliance part provided with the waterproof coating that is resistant to electric breakdown.

| Resistance to underwater energization | | | | |
|---|---|---|---|---|
| | | Time for the current to reach 1 mA under a certain voltage | | |
| | Thickness | 3.8 V | 5 V | 12.5 V |
| Result | 355 nm | >60 h | >45 h | >28 h |

Table 8 shows example IPX 7 Waterproof Rating test (1 m underwater for 30 min of immersion) results of the electric appliance part provided with the waterproof coating that is resistant to electric breakdown.

| IPX 7 Waterproof Rating test | |
|---|---|
| Result | The electric appliance part works normally |

Embodiment 3

A method for preparing a multi-functional protective coating through low power continuous discharge. The plasma discharge mode can be high frequency continuous discharge, and the waveform of the high frequency discharge can be bipolar pulses. The method can include the following operations:

(1) A target object is positioned into a reaction chamber of protective coating preparation equipment. The reaction chamber is then closed and vacuumed continuously until the vacuum degree in the reaction chamber is 130 millitorr. An inert gas (e.g., Ar) is then introduced into the reaction chamber. The target object can start moving in the reaction chamber using a movement mechanism. The target object can be a solid material. For example, the solid material can be bulk alloy steel. When the target object surfaces are provided with the coating that is resistant to organic solvent immersion and cosmetics, the surfaces can be exposed to the organic solvent test environment.

In some embodiments, the volume of the reaction chamber can be 480 L, the temperature in the reaction chamber can be controlled at 50° C., and the incoming flow of the inert gas can be 50-60 sccm. In some embodiments, as the target object moves in the reaction chamber, the movement forms a circular motion relative to the reaction chamber. The speed of the circular motion can be 3 r/min.

(2) A monomer vapor is then introduced into the reaction chamber until the vacuum degree reaches 150 millitorr, thereby enabling the plasma discharge and the chemical vapor deposition.

(3) The deposition process includes pretreatment and coating phases. In the pretreatment phase, the plasma discharge power can be around 250 W, and the continuous discharge time is around 580 s. Subsequently in the coating phase, the discharge power is adjusted to 45 W, and the time is 4000 s.

In some embodiments, cyclic repetition of the deposition process is used. In the pretreatment phase, the plasma discharge power can be around 200 W, and the time can be around 150 s. Subsequently in the coating phase, the plasma discharge power is adjusted to 20 W, and the time is adjusted to 1000 s. The pretreatment and coating phases are repeated for around six times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 200 W to 250 W) to account for different surface properties of the target objects and the formed layers. The discharge power in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 550 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 45%. The monofunctional unsaturated fluorocarbon resins can include (perfluoro cyclohexyl) methyl acrylate and 2-(perfluorohexyl) ethyl methacrylate. The polyfunctional unsaturated hydrocarbon derivatives can include ethoxylated trimethylolpropane triacrylate and diethylene glycol divinyl ether.

(4) When the coating is completed, the introduction of the monomer vapor is stopped. The plasma discharge is stopped as well. The reaction chamber is vacuumed continuously (e.g., for 3 minutes or longer) to reduce the vacuum degree of reaction chamber to 130 millitorr. Regular air is then introduced to the chamber to bring the pressure back to one barometric pressure. The target object then can be removed from the chamber.

Table 9 shows example test results of organic solvent immersion resistance.

| Material of target object | Chemical reagents | Time | | | |
|---|---|---|---|---|---|
| | | 48 h | 96 h | 144 h | 192 h |
| Alloy steel material | Acetone | pass | pass | pass | pass |
| | Cyclohexane | pass | pass | pass | pass |
| | Petroleum ether | pass | pass | pass | pass |
| | Xylene | pass | pass | pass | pass |
| | 1-Propanol | pass | pass | pass | pass |

Embodiment 4

A method for preparing a multi-functional protective coating through low power continuous discharge. The plasma discharge mode can be microwave continuous discharge. The method can include the following operations:

(1) A target object is positioned into a reaction chamber of protective coating preparation equipment. The reaction chamber is then closed and vacuumed continuously until the vacuum degree in the reaction chamber is 160 millitorr. An inert gas (e.g., He) is then introduced into the reaction chamber. The target object can start moving in the reaction chamber using a movement mechanism. The target object can be a solid material. For example, the solid material can be bulk aluminum alloy. The solid material can also include a PCB board. When the target object surfaces are provided with the coating that is resistant to thermal cycling impact and/or acidic and alkaline environments, the surfaces can be exposed to the corresponding test environment.

In some embodiments, the volume of the reaction chamber can be 680 L, the temperature in the reaction chamber can be controlled at 50° C., and the incoming flow of the inert gas can be around 160 sccm. In some embodiments, as the target object moves in the reaction chamber, the movement forms a linear reciprocating motion relative to the reaction chamber. The speed of the linear motion can be 20 mm/min.

(2) A monomer vapor is then introduced into the reaction chamber until the vacuum degree reaches 190 millitorr, thereby enabling the plasma discharge and the chemical vapor deposition.

(3) The deposition process includes pretreatment and coating phases. In the pretreatment phase, the plasma discharge power can be around 300 W, and the continuous discharge time is around 350 s. Subsequently in the coating phase, the discharge power is adjusted to around 55 W, and the time is around 2200 s.

In some embodiments, cyclic repetition of the deposition process is used. In the pretreatment phase, the plasma discharge power can be around 300 W, and the continuous discharge time is around 250 s. Subsequently in the coating phase, the discharge power is adjusted to around 35 W, and the time is around 2000 s. The pretreatment and coating phases are repeated for three times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 300 W to 400 W) to account for different surface properties of the target objects and the formed layers. The discharge power in the coating phase is gradually reduced (e.g., from 35 W to 10 W) in each cycle to form denser base layers and looser top layers. The discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 220 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 35-55%. The monofunctional unsaturated fluorocarbon resins can include 3,3,3-trifluoro-1-propyne, 3-(perfluoro-5-methyl hexyl)-2-hydroxypropyl methacrylate, and 1H, 1H, 2H, 2H-perfluoro octanol acrylate. The polyfunctional unsaturated hydrocarbon derivatives can include ethoxylated trimethylolpropane triacrylate, diacrylic gylcol ester, and 1, 6-hexanediol diacrylate.

(4) When the coating is completed, the introduction of the monomer vapor is stopped. The plasma discharge is stopped as well. The reaction chamber is vacuumed continuously (e.g., for 4 minutes or longer) to reduce the vacuum degree of reaction chamber to 160 millitorr. Regular air is then introduced to the chamber to bring the pressure back to one barometric pressure. The target object then can be removed from the chamber.

Table 10 shows example test results of acid and alkaline resistance.

| Material | Acid/alkali reagents | Time | | | |
|---|---|---|---|---|---|
| | | 96 h | 144 h | 192 h | 240 h |
| Aluminum alloy | Acidic salt spray | pass | pass | pass | pass |
| | Neutral salt spray | pass | pass | pass | pass |
| | Alkali salt spray | pass | pass | pass | pass |
| | 5% Acetic acid solution | pass | pass | pass | pass |
| | 5% NaOH Solution | pass | pass | pass | pass |

Table 11 shows example test results of thermal cycling impact resistance.

| Target object to be tested | Test condition | Number of cycles | Test time | Result detection |
|---|---|---|---|---|
| Aluminum alloy | −40° C.-+75° C. | 25 | 2 h | No effect on appearance Good performance |

-continued

| Target object to be tested | Test condition | Number of cycles | Test time | Result detection |
|---|---|---|---|---|
| PCB board | −40° C.-+75° C. | 25 | 2 h | No effect on appearance Good performance |

Embodiment 5

A method for preparing a multi-functional protective coating through low power continuous discharge. The plasma discharge mode can be spark discharge. The method can include the following operations:

(1) A target object is positioned into a reaction chamber of protective coating preparation equipment. The reaction chamber is then closed and vacuumed continuously until the vacuum degree in the reaction chamber is 200 millitorr. An inert gas (e.g., Ar) is then introduced into the reaction chamber. The target object can start moving in the reaction chamber using a movement mechanism. The target object can be a solid material. For example, the solid material can be an electronic component. When the target object surfaces are provided with the coating that is resistant to alternating dampness and heat, the surfaces can be exposed to the corresponding test environment.

In some embodiments, the volume of the reaction chamber can be 1000 L, the temperature in the reaction chamber can be controlled at 60° C., and the incoming flow of the inert gas can be around 300 sccm. In some embodiments, as the target object moves in the reaction chamber, the movement forms a curvilinear reciprocating motion relative to the reaction chamber. The speed of the motion can be 100 mm/min. In some embodiments, the movement forms a planetary motion with a revolution speed of 1 r/min. The auto ration speed can be 1.5 r/min.

(2) A monomer vapor is then introduced into the reaction chamber until the vacuum degree reaches 300 millitorr, thereby enabling the plasma discharge and the chemical vapor deposition.

(3) The deposition process includes pretreatment and coating phases. In the pretreatment phase, the plasma discharge power can be around 400 W, and the continuous discharge time is 60 s. Subsequently in the coating phase, the discharge power is adjusted to 75 W, and the time is 600 s.

In some embodiments, cyclic repetition of the deposition process is used. In the pretreatment phase, the plasma discharge power can be around 150 W, and the time can be around 400 s. Subsequently in the coating phase, the plasma discharge power is adjusted to 55 W, and the time is adjusted to 3000 s. The pretreatment and coating phases are repeated at least two times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 150 W to 200 W) to account for different surface properties of the target objects and the formed layers. The discharge power in the coating phase is gradually reduced (e.g., from 55 W to 20 W) in each cycle to form denser base layers and looser top layers. The discharge time can be changed accordingly based on the desired thickness of each layer.

The introduction of the monomer vapor is to atomize and volatilize the monomer through the feeding pump. Introducing the monomer vapor to the reaction chamber by a low pressure of 200 millitorr allows the incoming flow of the monomer to be around 10 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 65%. The monofunctional unsaturated fluorocarbon resins can include 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives can include tripropylene glycol diacrylate and diacrylic gylcol ester.

(4) When the coating is completed, the introduction of the monomer vapor is stopped. The plasma discharge is stopped as well. The reaction chamber is vacuumed continuously (e.g., for about 5 minutes) to reduce the vacuum degree of reaction chamber to 200 millitorr. Regular air is then introduced to the chamber to bring the pressure back to one barometric pressure. The target object then can be removed from the chamber.

Table 12 shows other example test results of alternating dampness and heat with different exposure time.

| | Test conditions and results | | | | | |
|---|---|---|---|---|---|---|
| Target object | | Temperature 25° C. | | | | |
| to be tested | Humidity | 75 | 80 | 85 | 90 | 95 |
| Electronic components | Time 12 h | Pass | Pass | Pass | Pass | Pass |
| | Time 24 h | Pass | Pass | Pass | Pass | Pass |
| | Time 36 h | Pass | Pass | Pass | Pass | Pass |
| | Time 48 h | Pass | Pass | Pass | Pass | Pass |

Table 13 shows example test results of alternating dampness and heat.

| | Test conditions and results | | | | | |
|---|---|---|---|---|---|---|
| Target object | | Temperature 85° C. | | | | |
| to be tested | Humidity | 75 | 80 | 85 | 90 | 95 |
| Electronic components | Time 24 h | Pass | Pass | Pass | Pass | Pass |
| | Time 48 h | Pass | Pass | Pass | Pass | Pass |
| | Time 72 h | Pass | Pass | Pass | Pass | Pass |
| | Time 96 h | Pass | Pass | Pass | Pass | Pass |

Embodiment 6

A method for preparing a multi-functional protective coating through low power continuous discharge. The plasma discharge mode can be continuous radio frequency discharge. The method can include the following operations:

(1) A target object is positioned into a reaction chamber of protective coating preparation equipment. The reaction chamber is then closed and vacuumed continuously until the vacuum degree in the reaction chamber is 120 millitorr. An inert gas (Ar) is then introduced into the reaction chamber. The target object can start moving in the reaction chamber using a movement mechanism. The target object can be a solid material. For example, the solid material can be an electric appliance part. The solid material can also be bulk aluminum material or a PCB board. When the target object surfaces are provided with a coating resistant to the thermal cycling impact, the surfaces can be exposed to the corresponding test environment.

In some embodiments, the volume of the reaction chamber can be 400 L, the temperature in the reaction chamber can be controlled at 40° C., and the incoming flow of the inert gas can be 150 sccm. In some embodiments, as the target object moves in the reaction chamber, the movement forms a circular motion relative to the reaction chamber. The speed of the circular movement can be 1 r/min.

(2) A monomer vapor is then introduced into the reaction chamber until the vacuum degree reaches 160 millitorr, thereby enabling the plasma discharge and the chemical vapor deposition.

(3) The deposition process includes pretreatment and coating phases. In the pretreatment phase, the plasma discharge power can be around 380 W, and the time can be around 400 s. Subsequently in the coating phase, the plasma discharge power is adjusted to around 20 W, and the time is adjusted to around 3600 s.

In some embodiments, cyclic repetition of the deposition process is used. In the pretreatment phase, the plasma discharge power can be around 180 W, and the time can be around 200 s. Subsequently in the coating phase, the plasma discharge power is adjusted to 60 W, and the time is adjusted to 1500 s. The pretreatment and coating phases are repeated for three times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 180 W to 300 W) to account for different surface properties of the target objects and the formed layers. The discharge power in the coating phase is gradually reduced (e.g., from 60 W to 20 W) in each cycle to form denser base layers and looser top layers. The discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 200 µL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 45-48%. The monofunctional unsaturated fluorocarbon resins can include 2-(perfluorodecyl) ethyl methacrylate, 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives include tripropylene glycol diacrylate and diethylene glycol divinyl ether.

(4) When the coating is completed, the introduction of the monomer vapor is stopped. The plasma discharge is stopped as well. The reaction chamber is vacuumed continuously (e.g., for about 5 minute or longer) to reduce the vacuum degree of reaction chamber to 160 millitorr. Regular air is then introduced to the chamber to bring the pressure back to one barometric pressure. The target object then can be removed from the chamber.

Table 14 shows am example test of the time for the current of the coating prepared in the present embodiment to reach 1 mA at different voltages.

|  | Voltage | | |
| --- | --- | --- | --- |
|  | 3.8 V | 5 V | 12.5 V |
| Time | >48 h | >24 h | >24 h |

In the IPX 7 test (water immersion test for 30 min at a depth of 1 m underwater), the electric appliance part worked normally.

Table 15 shows example test results of thermal cycling impact.

| Target object to be tested | Test condition | Cycle index | Test time | Result detection |
| --- | --- | --- | --- | --- |
| Aluminum material | −40° C.-+75° C. | 25 | 4 h | No effect on appearance Good performance |
| Printed circuit board | −40° C.-+75° C. | 25 | 4 h | No effect on appearance Good performance |

Embodiment 7

A method for preparing a multi-functional protective coating through high duty ratio pulse discharge. The plasma discharge mode can be continuous radio frequency discharge applied in a pulse manner. The method can include the following operations:

(1) A target object is positioned into a reaction chamber of protective coating preparation equipment. The reaction chamber is then closed and vacuumed continuously until the vacuum degree in the reaction chamber is 10 millitorr. An inert gas (Ar) is then introduced into the reaction chamber. The target object can start moving in the reaction chamber using a movement mechanism. The target object can be a solid material. For example, the solid material can be bulk aluminum material. When the target object surfaces are provided with a coating resistant to organic solvent immersion and cosmetics, the surfaces can be exposed to the organic solvent test environment.

In some embodiments, the volume of the reaction chamber can be 50 L, the temperature in the reaction chamber can be controlled at 30° C., and the incoming flow of the inert gas can be 5 sccm. In some embodiments, as the target object moves in the reaction chamber, the movement forms a circular motion relative to the reaction chamber. The speed of the circular movement can be 1-4 r/min.

(2) A monomer vapor is then introduced into the reaction chamber until the vacuum degree reaches 30 millitorr, thereby enabling the plasma discharge and the chemical vapor deposition.

(3) The deposition process includes pretreatment and coating phases. In the pretreatment phase, the plasma discharge power can be around 120 W, and the time can be around 900 s. Subsequently in the coating phase, the plasma discharge power is adjusted to around 50 W, and the time is adjusted to around 7200 s. The pulse frequency can be 1 Hz, and the pulse duty ratio is 1:1.

In some embodiments, cyclic repetition of the deposition process is used. In the pretreatment phase, the plasma discharge power can be around 400 W, and the time can be around 60 s. Subsequently in the coating phase, the plasma discharge power is adjusted to 200 W, and the time is adjusted to 600 s. The pulse frequency can remain at 1 Hz, and the pulse duty ratio can remain at 1:1. The pretreatment and coating phases are repeated for eleven times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase remains the same (e.g., 400 W) for all the cycles. The discharge power in the coating phase is gradually reduced (e.g., from 200 W to 100 W) in each cycle to form denser base layers and looser top layers. The discharge time can be changed accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 1000 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 15%. The monofunctional unsaturated fluorocarbon resins can include 2-perfluoro octyl ethyl acrylate and 2-(perfluorohexyl) ethyl methacrylate. The polyfunctional unsaturated hydrocarbon derivatives include diacrylic gylcol ester and 1,6-hexanediol diacrylate.

(4) When the coating is completed, the introduction of the monomer vapor is stopped. The plasma discharge is stopped as well. The reaction chamber is vacuumed continuously (e.g., for about 1 minute) to reduce the vacuum degree of reaction chamber to 10 millitorr. Regular air is then introduced to the chamber to bring the pressure back to one barometric pressure. The target object then can be removed from the chamber.

Table 16 shows example Hydrophobicity/lipophobicity effects.

| | hydrophobicity/lipophobicity | | |
|---|---|---|---|
| Thickness | Water contact angle | Oil contact angle | Adhesion |
| 250 nm | 125° | 93° | Low adhesion, water droplets easily slipped |

Table 17 shows another set of example Hydrophobicity/lipophobicity effects.

| | hydrophobicity/lipophobicity | | |
|---|---|---|---|
| Thickness | Water contact angle | Oil contact angle | Adhesion |
| 250 nm | 127° | 98° | Low adhesion, water droplets easily slipped |

Table 18 shows example results of the organic solvent resistance test.

| Material of target object | Chemical reagents | Time | | | |
|---|---|---|---|---|---|
| | | 48 h | 96 h | 144 h | 192 h |
| Aluminum plate | Acetone | pass | pass | pass | pass |
| | Cyclohexane | pass | pass | pass | pass |
| | Petroleum ether | pass | pass | pass | pass |
| | Xylene | pass | pass | pass | pass |
| | 1-Propanol | pass | pass | pass | pass |

Table 19 shows another set of example results of the organic solvent resistance test.

| Chemical reagents | Time | | | |
|---|---|---|---|---|
| | 64 h | 112 h | 160 h | 208 h |
| Acetone | pass | pass | pass | pass |
| Cyclohexane | pass | pass | pass | pass |
| Petroleum ether | pass | pass | pass | pass |
| Xylene | pass | pass | pass | pass |
| 1-Propanol | pass | pass | pass | pass |

Table 20 shows example results of the acidity/alkalinity test.

| target object | Acid/alkali reagents | Time | | | |
|---|---|---|---|---|---|
| | | 48 h | 96 h | 144 h | 192 h |
| Aluminum plate | Acidic salt spray | pass | pass | pass | pass |
| | Neutral salt spray | pass | pass | pass | pass |
| | Alkaline salt spray | pass | pass | pass | pass |
| | 5% Acetic acid solution | pass | pass | pass | pass |
| | 5% NaOH solution | pass | pass | pass | pass |

Table 21 shows another set of example results of the acidity/alkalinity test.

| Acid/alkali reagents | Time | | | |
|---|---|---|---|---|
| | 64 h | 112 h | 160 h | 208 h |
| Acidic salt spray | pass | pass | pass | pass |
| Neutral salt spray | pass | pass | pass | pass |

-continued

| Acid/alkali reagents | Time | | | |
|---|---|---|---|---|
| | 64 h | 112 h | 160 h | 208 h |
| Alkaline salt spray | pass | pass | pass | pass |
| 5% Acetic acid solution | pass | pass | pass | pass |
| 5% NaOH solution | pass | pass | pass | pass |

Embodiment 8

A method for preparing a multi-functional protective coating through high duty ratio pulse discharge. The plasma discharge mode can be intermediate frequency continuous discharge applied in a pulse manner, and the waveform of the intermediate frequency discharge can be sinusoidal pulses. The method can include the following operations:

(1) A target object is positioned into a reaction chamber of protective coating preparation equipment. The reaction chamber is then closed and vacuumed continuously until the vacuum degree in the reaction chamber is 60 millitorr. An inert gas (e.g., He) is then introduced into the reaction chamber. The target object can start moving in the reaction chamber using a movement mechanism. The target object can be a solid material. For example, the solid material can be bulk aluminum alloy. When the target object surfaces are provided with the acidic and alkaline environment resistant coating, the surfaces can be exposed to acidic and alkaline test environments.

In some embodiments, the volume of the reaction chamber can be 250 L, the temperature in the reaction chamber can be controlled at 40° C., and the incoming flow of the inert gas can be 15 sccm. In some embodiments, as the substrate moves in the reaction chamber, the movement forms a planetary motion relative to the reaction chamber. The revolution speed of the planetary motion can be 2-3 r/min, and the auto rotation speed is around 3.5-5 r/min.

(3) The deposition process includes pretreatment and coating phases. In the pretreatment phase, the plasma discharge power can be around 200 W, and the time is around 700 s. Subsequently in the coating phase, the discharge power is adjusted to around 80 W, and the time is 6200 s. The pulse frequency can be 20 Hz, and the pulse duty ratio can be 1:60.

In some embodiments, cyclic repetition of the deposition process is used. In the pretreatment phase, the plasma discharge power can be around 120 W, and the time can be around 450 s. Subsequently in the coating phase, the plasma discharge power is adjusted to 50 W, and the time is adjusted to 3600 s. The pulse frequency can be 60 Hz, and the pulse duty ratio can be 1:90. The pretreatment and coating phases are repeated for at least one time to prepare a multi-functional protective coating through chemical vapor deposition on the target object surface.

The discharge power and/or the discharge time in the pretreatment and coating phases can vary for each repetition to achieve the desired multi-layer coating structure. In one example, the discharge power in the pretreatment phase can vary (e.g., from 120 W to 200 W) to account for different surface properties of the target objects and the formed layers. The discharge power and pulse frequency in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 60 millitorr allows the incoming flow of the monomer to be 500-700 µL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 23-35%. The monofunctional unsaturated fluorocarbon resins can include 2-(perfluorodecyl) ethyl methacrylate, 2-(perfluorododecyl) ethyl acrylate, and (perfluoro cyclohexyl) methyl acrylate. The polyfunctional unsaturated hydrocarbon derivatives include tripropylene glycol diacrylate and poly (ethylene glycol) diacrylate.

(4) When the coating is completed, the introduction of the monomer vapor is stopped. The plasma discharge is stopped as well. The reaction chamber is vacuumed continuously (e.g., for about 2 minutes) to reduce the vacuum degree of reaction chamber to 80 millitorr. Regular air is then introduced to the chamber to bring the pressure back to one barometric pressure. The target object then can be removed from the chamber.

Table 22 shows example hydrophobicity/lipophobicity effect.

| | hydrophobicity/lipophobicity | | |
|---|---|---|---|
| Thickness | Water contact angle | Oil contact angle | Adhesion |
| 250 nm | 123° | 95° | Low adhesion, water droplets easily slipped |

Table 23 shows another example hydrophobicity/lipophobicity effect.

| | hydrophobicity/lipophobicity | | |
|---|---|---|---|
| Thickness | Water contact angle | Oil contact angle | Adhesion |
| 250 nm | 128° | 97° | Low adhesion, water droplets easily slipped |

Table 24 shows example results of the organic solvent resistance test.

| Material of target object | Chemical reagents | Time | | | |
|---|---|---|---|---|---|
| | | 48 h | 96 h | 144 h | 192 h |
| Aluminum alloy material | Acetone | pass | pass | pass | pass |
| | Cyclohexane | pass | pass | pass | pass |
| | Petroleum ether | pass | pass | pass | pass |
| | Xylene | pass | pass | pass | pass |
| | 1-Propanol | pass | pass | pass | pass |

Table 25 shows another set of example results of the organic solvent resistance test.

| Chemical reagents | Time | | | |
|---|---|---|---|---|
| | 64 h | 112 h | 160 h | 208 h |
| Acetone | pass | pass | pass | pass |
| Cyclohexane | pass | pass | pass | pass |
| Petroleum ether | pass | pass | pass | pass |
| Xylene | pass | pass | pass | pass |
| 1-Propanol | pass | pass | pass | pass |

Table 26 shows example results of the acidity/alkalinity test.

| Target object | Acid/alkali reagents | Time | | | |
|---|---|---|---|---|---|
| | | 48 h | 96 h | 144 h | 192 h |
| Aluminum plate | Acidic salt spray | pass | pass | pass | pass |
| | Neutral salt spray | pass | pass | pass | pass |
| | Alkaline salt spray | pass | pass | pass | pass |
| | 5% Acetic acid solution | pass | pass | pass | pass |
| | 5% NaOH solution | pass | pass | pass | pass |

Table 27 shows another set of example results of the acidity/alkalinity test.

| Acid/alkali reagents | Time | | | |
|---|---|---|---|---|
| | 64 h | 112 h | 160 h | 208 h |
| Acidic salt spray | pass | pass | pass | pass |
| Neutral salt spray | pass | pass | pass | pass |
| Alkaline salt spray | pass | pass | pass | pass |
| 5% Acetic acid solution | pass | pass | pass | pass |
| 5% NaOH solution | pass | pass | pass | pass |

Embodiment 9

A method for preparing a multi-functional protective coating through high duty ratio pulse discharge. The plasma discharge mode can be high frequency continuous discharge applied in a pulse manner, and the waveform of the high frequency discharge can be bipolar pulses. The method can include the following operations:

(1) A target object is positioned into a reaction chamber of protective coating preparation equipment. The reaction chamber is then closed and vacuumed continuously until the vacuum degree in the reaction chamber is 130 millitorr. An inert gas (e.g., Ar) is then introduced into the reaction chamber. The target object can start moving in the reaction chamber using a movement mechanism. The target object can be a solid material. For example, the solid material can be bulk aluminum material or a PCB board. When the target object surfaces are provided with a coating resistant to thermal cycling impact, the surfaces can be exposed to the thermal cycling test environment.

In some embodiments, the volume of the reaction chamber can be 480 L, the temperature in the reaction chamber can be controlled at 50° C., and the incoming flow of the inert gas can be 50-60 sccm. In some embodiments, as the target object moves in the reaction chamber, the movement forms a circular motion relative to the reaction chamber. The speed of the circular motion can be 2-5 r/min.

(2) A monomer vapor is then introduced into the reaction chamber until the vacuum degree reaches 150 millitorr, thereby enabling the plasma discharge and the chemical vapor deposition.

(3) The deposition process includes pretreatment and coating phases. In the pretreatment phase, the plasma discharge power can be around 250 W, and the continuous discharge time is around 580 s. Subsequently in the coating phase, the discharge power is adjusted to 140 W, and the time is 5000 s. The pulse frequency can be 90 Hz, and the pulse duty ratio can be 1:110.

In some embodiments, cyclic repetition of the deposition process is used. In the pretreatment phase, the plasma discharge power can be around 200 W, and the time can be around 150 s. Subsequently in the coating phase, the plasma discharge power is adjusted to 80 W, and the time is adjusted to 1000 s. The pulse frequency can be 200 Hz, and the pulse duty ratio can be 1:180. The pretreatment and coating phases are repeated for around five times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 200 W to 250 W) to account for different surface properties of the target objects and the formed layers. The discharge power, pulse frequency, and pulse duty ratio in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 550 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 32-35%. The monofunctional unsaturated fluorocarbon resins can include (perfluoro cyclohexyl) methyl acrylate and 2-(perfluorohexyl) ethyl methacrylate. The polyfunctional unsaturated hydrocarbon derivatives can include ethoxylated trimethylolpropane triacrylate and diethylene glycol divinyl ether. Alternatively, the polyfunctional unsaturated hydrocarbon derivatives can include ethoxylated trimethylolpropane triacrylate and 1, 6-hexanediol diacrylate.

(4) When the coating is completed, the introduction of the monomer vapor is stopped. The plasma discharge is stopped as well. The reaction chamber is vacuumed continuously (e.g., for 3 minutes or longer) to reduce the vacuum degree of reaction chamber to 130 millitorr. Regular air is then introduced to the chamber to bring the pressure back to one barometric pressure. The target object then can be removed from the chamber.

Table 28 shows example thermal cycling test results.

| Target object to be tested | Test condition | Number of cycles | Test time | Result detection |
|---|---|---|---|---|
| Aluminum material | −40° C.-+75° C. | 25 | 2 h | No effect on appearance Good performance |
| PCB board | −40° C.-+75° C. | 25 | 2 h | No effect on appearance Good performance |

Table 29 shows example thermal cycling impact test results of the coated aluminum material

| Target object to be tested | Test condition | Number of cycles | Test time | Result detection |
|---|---|---|---|---|
| Aluminum target object | −40° C.-+75° C. | 25 | 6 h | No effect on appearance Good performance |
| PCB board | −40° C.-+75° C. | 25 | 6 h | No effect on appearance Good performance |

Embodiment 10

A method for preparing a multi-functional protective coating through high duty ratio pulse discharge. The plasma discharge mode can be microwave continuous discharge applied in a pulse manner. The method can include the following operations:

(1) A target object is positioned into a reaction chamber of protective coating preparation equipment. The reaction chamber is then closed and vacuumed continuously until the vacuum degree in the reaction chamber is 160 millitorr. An inert gas (e.g., He) is then introduced into the reaction chamber. The target object can start moving in the reaction chamber using a movement mechanism. The target object can be a solid material. For example, the solid material can be a block of bulk aluminum alloy. When the target object surfaces are provided with a coating resistant to alternating dampness and heat, the surfaces can be exposed to the dampness and heat test environment.

In some embodiments, the volume of the reaction chamber can be 680 L, the temperature in the reaction chamber can be controlled at 50° C., and the incoming flow of the inert gas can be around 160 sccm. In some embodiments, as the target object moves in the reaction chamber, the movement forms a straight reciprocating motion relative to the reaction chamber. The speed of the straight motion can be 12-40 mm/min.

(2) A monomer vapor is then introduced into the reaction chamber until the vacuum degree reaches 190 millitorr, thereby enabling the plasma discharge and the chemical vapor deposition.

(3) The deposition process includes pretreatment and coating phases. In the pretreatment phase, the plasma discharge power can be around 300 W, and the continuous discharge time is around 350 s. Subsequently in the coating phase, the discharge power is adjusted to around 230 W, and the time is around 2500 s. The pulse frequency can be 380 Hz, and the pulse duty ratio can be 1:260.

In some embodiments, cyclic repetition of the deposition process is used. In the pretreatment phase, the plasma discharge power can be around 300 W, and the continuous discharge time is around 250 s. Subsequently in the coating phase, the discharge power is adjusted to around 120 W, and the time is around 2000 s. The pulse frequency can be 400 Hz, and the pulse duty ratio can be 1:400. The pretreatment and coating phases are repeated for three times to prepare a multi-functional protective coating through chemical vapor deposition on the target object surfaces. The discharge power and/or the discharge time in the pretreatment and coating phases can vary for each repetition to achieve the desired multi-layer coating structure.

The discharge power and/or the discharge time in the pretreatment and coating phases can vary for each repetition to achieve the desired multi-layer coating structure. In one example, the discharge power in the pretreatment phase can vary (e.g., from 300 W to 400 W) to account for different surface properties of the target objects and the formed layers. The discharge power in the coating phase is gradually reduced (e.g., from 120 W to 80 W) in each cycle to form denser base layers and looser top layers. The pulse frequency and the pulse duty ratio can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 220 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 39-51%. The monofunctional unsaturated fluorocarbon resins can include 3,3,3-trifluoro-1-propyne, 3-(perfluoro-5-methyl hexyl)-2-hydroxypropyl methacrylate, and 1H, 1H, 2H, 2H-perfluoro octanol acrylate. The polyfunctional unsaturated hydrocarbon derivatives can include ethoxylated trimethylolpropane triacrylate, diacrylic gylcol ester, and 1,6-hexanediol diacrylate.

(4) When the coating is completed, the introduction of the monomer vapor is stopped. The plasma discharge is stopped as well. The reaction chamber is vacuumed continuously (e.g., for 4 minutes or longer) to reduce the vacuum degree of reaction chamber to 160 millitorr. Regular air is then introduced to the chamber to bring the pressure back to one barometric pressure. The target object then can be removed from the chamber.

Table 30 shows example test results of alternating dampness and heat.

| | | | Test conditions and results | | | | | |
|---|---|---|---|---|---|---|---|---|
| Target object | | | Temperature 25° C. | | | | | |
| to be tested | Humidity | | 75% | 80% | 85% | 90% | 95% |
| Aluminum target object | Time | 12 h | Pass | Pass | Pass | Pass | Pass |
| | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |

Table 31 shows another set of example dampness and heat test results of the coated bulk aluminum alloy material.

| Target object to be tested | | | Test conditions and results | | | | |
|---|---|---|---|---|---|---|---|
| | | | Temperature 85° C. | | | | |
| | Humidity | | 75% | 80% | 85% | 90% | 95% |
| Aluminum alloy material | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |
| | Time | 60 h | Pass | Pass | Pass | Pass | Pass |

Embodiment 11

A method for preparing a multi-functional protective coating through high duty ratio pulse discharge. The plasma discharge mode can be spark discharge. The method can include the following operations:

(1) A target object is positioned into a reaction chamber of protective coating preparation equipment. The reaction chamber is then closed and vacuumed continuously until the vacuum degree in the reaction chamber is 200 millitorr. An inert gas (e.g., Ar) is then introduced into the reaction chamber. The target object can start moving in the reaction chamber using a movement mechanism. The target object can be a solid material. For example, the solid material can be a block of a Teflon plate or an electric appliance part. When the target object surfaces are provided with a fungus resistant protective coating, the surfaces can be exposed to a fungus test environment under GJB150.10A-2009. When the target object surfaces are provided with the coating which is waterproof and resistant to electric breakdown, the surfaces can be exposed to the environment described in the International Industrial Waterproof Rating IPX7.

In some embodiments, the volume of the reaction chamber can be 1000 L, the temperature in the reaction chamber can be controlled at 60° C., and the incoming flow of the inert gas can be around 300 sccm. In some embodiments, as the target object moves in the reaction chamber, the movement forms a curvilinear reciprocating motion relative to the reaction chamber. The speed of the motion can be 100 mm/min. In some embodiments, the movement forms a planetary motion with a revolution speed of 3 r/min. The auto ration speed can be 4.5 r/min.

(2) A monomer vapor is then introduced into the reaction chamber until the vacuum degree reaches 300 millitorr, thereby enabling the plasma discharge and the chemical vapor deposition.

(3) The deposition process includes pretreatment and coating phases. In the pretreatment phase, the plasma discharge power can be around 400 W, and the continuous discharge time is 60 s. Subsequently in the coating phase, the discharge power is adjusted to 360 W, and the time is 1200 s. The pulse frequency can be 850 Hz, and the pulse duty ratio can be 1:370.

In some embodiments, cyclic repetition of the deposition process is used. In the pretreatment phase, the plasma discharge power can be around 150 W, and the time can be around 400 s. Subsequently in the coating phase, the plasma discharge power is adjusted to 160 W, and the time is adjusted to 3000 s. The pretreatment and coating phases are repeated at least two times to prepare a multi-functional protective coating through chemical vapor deposition on the target object surfaces. The pulse frequency can be 700 Hz, and the pulse duty ratio can be 1:800.

The discharge power and/or the discharge time in the pretreatment and coating phases can vary for each repetition to achieve the desired multi-layer coating structure. In one example, the discharge power in the pretreatment phase can vary (e.g., from 150 W to 200 W) to account for different surface properties of the target objects and the formed layers. The discharge power in the coating phase is gradually reduced (e.g., from 160 W to 100 W) in each cycle to form denser base layers and looser top layers. The pulse frequency and the pulse duty ratio can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 200 millitorr allows the incoming flow of the monomer to be around 10 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 65%. The monofunctional unsaturated fluorocarbon resins can include 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives can include tripropylene glycol diacrylate and diacrylic gylcol ester.

(4) When the coating is completed, the introduction of the monomer vapor is stopped. The plasma discharge is stopped as well. The reaction chamber is vacuumed continuously (e.g., for about 5 minutes) to reduce the vacuum degree of reaction chamber to 200 millitorr. Regular air is then introduced to the chamber to bring the pressure back to one barometric pressure. The target object then can be removed from the chamber.

Table 32 shows example results of GJB150.10A-2009 fungus test on the above coated Teflon plate.

| Test sample | Water contact angle | Fungus resistance grade | Degree of surface fungus spots |
|---|---|---|---|
| Teflon plate | 134° | Grade 2 | Around 5% |

Table 33 shows another set of example results of GJB150.10A-2009 fungus test on the above coated Teflon plate.

| Teflon plate - Performance test | |
|---|---|
| Water contact angle | 138° |
| Oil contact angle | 98° |
| Fungus resistance grade | Grade 2 |
| Degree of surface fungus spots | 4% |

Table 34 shows example IPX 7 Waterproof Rating test (water immersion test for 30 min at a depth of 1 m underwater).

| IPX7 Waterproof Rating test | |
|---|---|
| Electric appliance part | The part works normally |

Embodiment 12

A method for preparing a multi-functional protective coating through low power continuous discharge. The plasma discharge mode can be continuous radio frequency discharge. The method can include the following operations:

(1) A target object is positioned into a reaction chamber of protective coating preparation equipment. The reaction chamber is then closed and vacuumed continuously until the vacuum degree in the reaction chamber is 120 millitorr. An inert gas (Ar) is then introduced into the reaction chamber. The target object can start moving in the reaction chamber using a movement mechanism. The target object can be a solid material. For example, the solid material can be a block of a Teflon plate or an electric appliance part. When the target object surfaces are provided with the fungus resistant protective coating, the surfaces can be exposed to a fungus test environment under GJB150.10A-2009. When the target object surfaces are provided with a coating which is waterproof and resistant to electric breakdown, the surfaces can be exposed to the environment described in the International Industrial Waterproof Rating IPX7.

In some embodiments, the volume of the reaction chamber can be 400 L, the temperature in the reaction chamber can be controlled at 40° C., and the incoming flow of the inert gas can be 150 sccm. In some embodiments, as the target object moves in the reaction chamber, the movement forms a circular motion relative to the reaction chamber. The speed of the circular movement can be 1 r/min.

(2) A monomer vapor is then introduced into the reaction chamber until the vacuum degree reaches 160 millitorr, thereby enabling the plasma discharge and the chemical vapor deposition.

(3) The deposition process includes pretreatment and coating phases. In the pretreatment phase, the plasma discharge power can be around 380 W, and the time can be around 400 s. Subsequently in the coating phase, the plasma discharge power is adjusted to around 400 W, and the time is adjusted to around 600 s. The pulse frequency can be 1000 Hz, and the pulse duty ratio can be 1:500.

In some embodiments cyclic repetition of the deposition process is used. In the pretreatment phase, the plasma discharge power can be around 180 W, and the time can be around 200 s. Subsequently in the coating phase, the plasma discharge power is adjusted to 180 W, and the time is adjusted to 1500 s. The pulse frequency can be 1000 Hz, and the pulse duty ratio can be 1:1000. The pretreatment and coating phases are repeated for three times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 180 W to 250 W) to account for different surface properties of the target objects and the formed layers. The discharge power in the coating phase is gradually reduced (e.g., from 180 W to 100 W) in each cycle to form denser base layers and looser top layers. The pulse frequency and the pulse duty ratio can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 200 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 45-48%. The monofunctional unsaturated fluorocarbon resins can include 2-(perfluorodecyl) ethyl methacrylate, 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives include tripropylene glycol diacrylate and diethylene glycol divinyl ether.

(4) When the coating is completed, the introduction of the monomer vapor is stopped. The plasma discharge is stopped as well. The reaction chamber is vacuumed continuously (e.g., for about 5 minute or longer) to reduce the vacuum degree of reaction chamber to 160 millitorr. Regular air is then introduced to the chamber to bring the pressure back to one barometric pressure. The target object then can be removed from the chamber.

Table 35 shows example results of GJB150.10A-2009 fungus test.

| Teflon - Performance test | |
|---|---|
| Water contact angle | 139° |
| Oil contact angle | 97° |
| Fungus resistance grade | Grade 2 |
| Degree of surface fungus spots | 4% |

Table 36 shows an example test of the time for the current of the coating prepared in the present embodiment to reach 1 mA at different voltages.

| | Time for the current to reach 1 mA at certain voltage | | |
|---|---|---|---|
| Voltage | 3.8 V | 5 V | 12.5 V |
| Time | >48 h | >36 h | >24 h |

Table 37 shows another underwater immersion test results of the above coated electric appliance part.

| | Underwater energization resistance | | |
|---|---|---|---|
| | Time for the current to reach 1 mA at certain voltage | | |
| | 3.8 V | 5 V | 12.5 V |
| Electric appliance part | >60 h | >45 h | >35 h |

In the IPX 7 test (water immersion test for 30 min at a depth of 1 m underwater), the electric appliance part works normally.

Embodiment 13

A method for preparing a multi-functional protective coating through periodic alternating discharge. The plasma discharge mode can be continuous radio frequency discharge. The method can include the following operations:

(1) A target object is positioned into a reaction chamber of protective coating preparation equipment. The reaction chamber is then closed and vacuumed continuously until the vacuum degree in the reaction chamber is 10 millitorr. An inert gas (e.g., Ar) is then introduced into the reaction chamber. The target object can start moving in the reaction chamber using a movement mechanism. The target object can be a solid material. For example, the solid material can be bulk aluminum material or a PCB board. When the target object surfaces are provided with a coating resistant to thermal cycling impact, the surfaces can be exposed to the thermal cycling test environment.

In some embodiments, the volume of the reaction chamber can be 50 L, the temperature in the reaction chamber can be controlled at 30° C., and the incoming flow of the inert gas can be 5 sccm. In some embodiments, as the target object moves in the reaction chamber, the movement forms a circular motion relative to the reaction chamber. The speed of the circular movement can be 4 r/min.

(2) A monomer vapor is then introduced into the reaction chamber until the vacuum degree reaches 30 millitorr, thereby enabling the plasma discharge and the chemical vapor deposition.

(3) The deposition process includes pretreatment and coating phases. In the pretreatment phase, the plasma discharge power can be around 120 W, and the time can be around 900 s. Subsequently in the coating phase, the plasma discharge power is adjusted to 50 W, and the time is adjusted to 3600 s. The alternating frequency can be 1 Hz.

In some embodiments, cyclic repetition of the deposition process is used. In the pretreatment phase, the plasma discharge power can be around 400 W, and the time can be around 60 s. Subsequently in the coating phase, the plasma discharge power is adjusted to 200 W, and the time is adjusted to 600 s. The alternating frequency can be 1 Hz. The pretreatment and coating phases can be repeated for ten times to prepare a protective coating through chemical vapor deposition on the target object surface. The discharge power and/or the discharge time in the pretreatment and coating phases can vary for each repetition to achieve the desired multi-layer coating structure.

The discharge power and/or the discharge time in the pretreatment and coating phases can vary for each repetition to achieve the desired multi-layer coating structure. In one example, the discharge power in the pretreatment phase remains the same (e.g., 400 W) for all the cycles. The discharge power in the coating phase is gradually reduced (e.g., from 200 W to 100 W) in each cycle to form denser base layers and looser top layers. The alternating frequency can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 1000 µL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 15%. The monofunctional unsaturated fluorocarbon resins can include 2-perfluoro octyl ethyl acrylate and 2-(perfluorohexyl) ethyl methacrylate. The polyfunctional unsaturated hydrocarbon derivatives include diacrylic gylcol ester and 1,6-hexanediol diacrylate.

(4) When the coating is completed, the introduction of the monomer vapor is stopped. The plasma discharge is stopped as well. The reaction chamber is vacuumed continuously (e.g., for about 1 minute) to reduce the vacuum degree of reaction chamber to 10 millitorr. Regular air is then introduced to the chamber to bring the pressure back to one barometric pressure. The target object then can be removed from the chamber.

Table 38 shows example thermal cycling impact test results.

| Target object to be tested | Test condition | Number of cycles | Test time | Result detection |
|---|---|---|---|---|
| Aluminum material | −40° C.-+75° C. | 25 | 8 h | No effect on appearance Good performance |
| PCB board | −40° C.-+75° C. | 25 | 8 h | No effect on appearance Good performance |

Table 39 shows another set of example thermal cycling impact test results.

| Target object to be tested | Test condition | Number of cycles | Test time | Result detection |
|---|---|---|---|---|
| Aluminum material | −40° C.-+75° C. | 25 | 2 h | No effect on appearance Good performance |
| PCB board | −40° C.-+75° C. | 25 | 2 h | No effect on appearance Good performance |

Table 40 shows example dampness and heat test results.

| | | | Test condition | | | | |
|---|---|---|---|---|---|---|---|
| | | | Temperature 55° C. | | | | |
| | Humidity | | 75% | 80% | 85% | 90% | 95% |
| Aluminum material | Time | 12 h | Pass | Pass | Pass | Pass | Pass |
| | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |

Table 41 shows another set of example dampness and heat test results.

| Target object | Test conditions and results Test condition | | | | | | |
|---|---|---|---|---|---|---|---|
| | | | Temperature 85° C. Humidity | | | | |
| to be tested | | | 75% | 80% | 85% | 90% | 95% |
| Aluminum material | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |
| | Time | 60 h | Pass | Pass | Pass | Pass | Pass |

Embodiment 14

A method for preparing a multi-functional protective coating through periodic alternating discharge. The plasma discharge mode can be microwave discharge. The method can include the following operations:

(1) A target object is positioned into a reaction chamber of protective coating preparation equipment. The reaction chamber is then closed and vacuumed continuously until the vacuum degree in the reaction chamber is 60 millitorr. An inert gas (e.g., He) is then introduced into the reaction chamber. The target object can start moving in the reaction chamber using a movement mechanism. The target object can be a solid material. For example, the solid material can be bulk aluminum material. When the target object surfaces are provided with a coating resistant to alternating dampness and heat, the surfaces can be exposed to the dampness and heat test environment.

In some embodiments, the volume of the reaction chamber can be 250 L, the temperature in the reaction chamber can be controlled at 40° C., and the incoming flow of the inert gas can be 15 sccm. In some embodiments, as the target object moves in the reaction chamber, the movement forms a planetary motion relative to the reaction chamber. The revolution speed of the planetary motion can be 3-6 r/min, and the auto rotation speed is between 3-4.5 r/min.

(2) A monomer vapor is then introduced into the reaction chamber until the vacuum degree reaches 90 millitorr, thereby enabling the plasma discharge and the chemical vapor deposition.

(3) The deposition process includes pretreatment and coating phases. In the pretreatment phase, the plasma discharge power can be around 200 W, and the time is around 700 s. Subsequently in the coating phase, the discharge power is adjusted to around 80 W, and the time is 3000 s. The alternating frequency is 20 Hz.

In some embodiments, cyclic repetition of the deposition process is used. In the pretreatment phase, the plasma discharge power can be around 120 W, and the time can be around 450 s. Subsequently in the coating phase, the plasma discharge power is adjusted to 50 W, and the time is adjusted to 3600 s. The alternating frequency is 1000 Hz. The pretreatment and coating phases are repeated for at least one time to prepare a multi-functional protective coating through chemical vapor deposition on the target object surface.

The discharge power and/or the discharge time in the pretreatment and coating phases can vary for each repetition to achieve the desired multi-layer coating structure. In one example, the discharge power in the pretreatment phase can vary (e.g., from 120 W to 200 W) to account for different surface properties of the target objects and the formed layers. The discharge power and alternating frequency in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 60 millitorr allows the incoming flow of the monomer to be 500-700 µL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 28-35%. The monofunctional unsaturated fluorocarbon resins can include 2-(perfluorodecyl) ethyl methacrylate, 2-(perfluorododecyl) ethyl acrylate, and (perfluoro cyclohexyl) methyl acrylate. The polyfunctional unsaturated hydrocarbon derivatives include tripropylene glycol diacrylate and poly (ethylene glycol) diacrylate.

(4) When the coating is completed, the introduction of the monomer vapor is stopped. The plasma discharge is stopped as well. The reaction chamber is vacuumed continuously (e.g., for about 2 minutes) to reduce the vacuum degree of reaction chamber to 80 millitorr. Regular air is then introduced to the chamber to bring the pressure back to one barometric pressure. The target object then can be removed from the chamber.

Table 42 shows example thermal cycling impact test results.

| Target object to be tested | Test condition | Number of cycles | Test time | Result detection |
|---|---|---|---|---|
| Aluminum material | −40° C.-+75° C. | 25 | 2 h | No effect on appearance Good performance |

Table 43 shows another set of example thermal cycling impact test results.

| Target object to be tested | Test condition | Number of cycles | Test time | Result detection |
|---|---|---|---|---|
| Aluminum material | −40° C.-+75° C. | 25 | 8 h | No effect on appearance Good performance |

Table 44 shows example results of alternating dampness and heat test.

| | | | Test condition | | | | |
|---|---|---|---|---|---|---|---|
| | | | Temperature 55° C. | | | | |
| | Humidity | | 75% | 80% | 85% | 90% | 95% |
| Aluminum material | Time | 12 h | Pass | Pass | Pass | Pass | Pass |
| | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |

Table 45 shows another set of example results of alternating dampness and heat test.

| Target object to be tested | Test conditions and results Test condition | | | | | | |
|---|---|---|---|---|---|---|---|
| | | | Temperature 85° C. Humidity | | | | |
| | | | 75% | 80% | 85% | 90% | 95% |
| Aluminum material | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |
| | Time | 60 h | Pass | Pass | Pass | Pass | Pass |

Embodiment 15

A method for preparing a multi-functional protective coating through periodic alternating discharge. The plasma discharge mode can be intermediate frequency discharge, and the waveform of the intermediate frequency discharge can be sinusoidal or bipolar. The method can include the following operations:

(1) A target object is positioned into a reaction chamber of protective coating preparation equipment. The reaction chamber is then closed and vacuumed continuously until the vacuum degree in the reaction chamber is 130 millitorr. An inert gas (e.g., Ar) is then introduced into the reaction chamber. The target object can start moving in the reaction chamber using a movement mechanism. The target object can be a solid material. For example, the solid material can be a block of a Teflon plate and an electric appliance part. When the target object are provided with the fungus resistant protective coating, the surfaces can be exposed to a fungus test environment under GJB150.10A-2009. When the target object surfaces are provided with the coating which is waterproof and resistant to electric breakdown, the surfaces can be exposed to the environment described in the International Industrial Waterproof Rating IPX7.

In some embodiments, the volume of the reaction chamber can be 480 L, the temperature in the reaction chamber can be controlled at 50° C., and the incoming flow of the inert gas can be 50-60 sccm. In some embodiments, as the target object moves in the reaction chamber, the movement forms a circular motion relative to the reaction chamber. The speed of the circular motion can be 5-6 r/min.

(2) A monomer vapor is then introduced into the reaction chamber until the vacuum degree reaches 150 millitorr, thereby enabling the plasma discharge and the chemical vapor deposition.

(3) The deposition process includes pretreatment and coating phases. In the pretreatment phase, the plasma discharge power can be around 250 W, and the continuous discharge time is around 580 s. Subsequently in the coating phase, the discharge power is adjusted to 120 W, and the time is 2200 s. The alternating frequency is 160 Hz.

In some embodiments, cyclic repetition of the deposition process is used. In the pretreatment phase, the plasma discharge power can be around 200 W, and the time can be around 150 s. Subsequently in the coating phase, the plasma discharge power is adjusted to 160 W, and the time is adjusted to 1000 s. The alternating frequency is 780 Hz. The pretreatment and coating phases are repeated for around six times to prepare a multi-functional protective coating through chemical vapor deposition on the target object surface.

The discharge power and/or the discharge time in the pretreatment and coating phases can vary for each repetition to achieve the desired multi-layer coating structure. In one example, the discharge power in the pretreatment phase can vary (e.g., from 200 W to 250 W) to account for different surface properties of the target objects and the formed layers. The discharge power and the alternating frequency in the coating phase remain the same in each cycle to form layers having substantially the same thickness. The discharge time can be determined accordingly based on the desired thickness of each layer.

The introduction of the monomer vapor is to atomize and volatilize the monomer through the feeding pump. Introducing the monomer vapor to the reaction chamber by a low pressure of 10 millitorr allows the incoming flow of the monomer to be around 550 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 45%. The monofunctional unsaturated fluorocarbon resins can include (perfluoro cyclohexyl) methyl acrylate and 2-(perfluorohexyl) ethyl methacrylate. The polyfunctional unsaturated hydrocarbon derivatives can include ethoxylated trimethylolpropane triacrylate and diethylene glycol divinyl ether.

(4) When the coating is completed, the introduction of the monomer vapor is stopped. The plasma discharge is stopped as well. The reaction chamber is vacuumed continuously (e.g., for 3 minutes or longer) to reduce the vacuum degree of reaction chamber to 130 millitorr. Regular air is then introduced to the chamber to bring the pressure back to one barometric pressure. The target object then can be removed from the chamber.

Table 46 shows example results of GJB150.10A-2009 fungus test.

| Teflon plate - Performance test | |
|---|---|
| Water contact angle | 132° |
| Oil contact angle | 93° |
| Fungus resistance grade | Grade 2 |
| Degree of surface fungus spots | 6% |

Table 47 shows another set of example results of GJB150.10A-2009 fungus test.

| Water contact angle | 136° |
|---|---|
| Oil contact angle | 97° |
| Fungus resistance grade | Grade 2 |
| Degree of surface fungus spots | 4% |

Table 48 shows example underwater immersion test results of the electric appliance part.

| | Underwater energization resistance | | |
|---|---|---|---|
| | Time for the current to reach 1 mA at certain voltage | | |
| | 3.8 V | 5 V | 12.5 V |
| Electric applicant part | >48 h | >24 h | >24 h |

Table 49 shows another set of example underwater immersion test results of the electric appliance part.

| Time for the current to reach 1 mA at certain voltage | | |
|---|---|---|
| 3.8 V | 5 V | 12.5 V |
| >70 h | >52 h | >48 h |

Table 50 shows example IPX 7 Waterproof Rating test results with water immersion for 30 min at a depth of 1 m underwater.

| IPX7 Waterproof Rating test | |
|---|---|
| The electric appliance part | The part works normally |

Embodiment 16

A method for preparing a multi-functional protective coating through periodic alternating discharge. The plasma discharge mode can be high frequency discharge, and the waveform of the high frequency discharge can be sinusoidal or bipolar. The method can include the following operations:

(1) A target object is positioned into a reaction chamber of protective coating preparation equipment. The reaction chamber is then closed and vacuumed continuously until the vacuum degree in the reaction chamber is 160 millitorr. An inert gas (e.g., He) is then introduced into the reaction chamber. The target object can start moving in the reaction chamber using a movement mechanism. The target object can be a solid material. For example, the solid material can be a block of a Teflon plate and an electric appliance part. When the target object surfaces are provided with the fungus resistant protective coating, the surfaces can be exposed to a fungus test environment under GJB150.10A-2009. When the target object surfaces are provided with the coating which is waterproof and resistant to electric breakdown, the surfaces can be exposed to the environment described in the International Industrial Waterproof Rating IPX7.

In some embodiments, the volume of the reaction chamber can be 680 L, the temperature in the reaction chamber can be controlled at 50° C., and the incoming flow of the inert gas can be around 160 sccm. In some embodiments, as the target object moves in the reaction chamber, the movement forms a straight reciprocating motion relative to the reaction chamber. The speed of the straight motion can be 25 mm/min.

(2) A monomer vapor is then introduced into the reaction chamber until the vacuum degree reaches 190 millitorr, thereby enabling the plasma discharge and the chemical vapor deposition.

(3) The deposition process includes pretreatment and coating phases. In the pretreatment phase, the plasma discharge power can be around 300 W, and the continuous discharge time is around 350 s. Subsequently in the coating phase, the discharge power is adjusted to around 160 W, and the time is around 1500 s. The alternating frequency is 490 Hz. The output waveform of plasma periodic alternating discharge can be a bun shape waveform. The waveform of the high frequency discharge can be a bipolar pulse.

In some embodiments, cyclic repetition of the deposition process is used. In the pretreatment phase, the plasma discharge power can be around 300 W, and the continuous discharge time is around 250 s. Subsequently in the coating phase, the discharge power is adjusted to around 120 W, and the time is around 2000 s. The alternating frequency is 600 Hz. The output waveform of plasma periodic alternating discharge can be a bun shape waveform. The waveform of the high frequency discharge can be a sinusoidal pulse. The pretreatment and coating phases are repeated for three times to prepare a multi-functional protective coating through chemical vapor deposition on the target object surface.

The discharge power and/or the discharge time in the pretreatment and coating phases can vary for each repetition to achieve the desired multi-layer coating structure. In one example, the discharge power in the pretreatment phase can vary (e.g., from 300 W to 400 W) to account for different surface properties of the target objects and the formed layers. The discharge power in the coating phase is gradually reduced (e.g., from 120 W to 50 W) in each cycle to form denser base layers and looser top layers. The alternating frequency can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 220 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 47-52%. The monofunctional unsaturated fluorocarbon resins can include 3,3,3-trifluoro-1-propyne, 3-(perfluoro-5-methyl hexyl)-2-hydroxypropyl methacrylate, and 1H, 1H, 2H, 2H-perfluoro octanol acrylate. The polyfunctional unsaturated hydrocarbon derivatives can include ethoxylated trimethylolpropane triacrylate, diacrylic gylcol ester, and 1, 6-hexanediol diacrylate.

(4) When the coating is completed, the introduction of the monomer vapor is stopped. The plasma discharge is stopped as well. The reaction chamber is vacuumed continuously (e.g., for 4 minutes or longer) to reduce the vacuum degree of reaction chamber to 160 millitorr. Regular air is then introduced to the chamber to bring the pressure back to one barometric pressure. The target object then can be removed from the chamber.

Table 51 shows example results of GJB150.10A-2009 fungus test.

| Teflon - Performance test | |
|---|---|
| Water contact angle | 131° |
| Oil contact angle | 94° |
| Fungus resistance grade | Grade 2 |
| Degree of surface fungus spots | 7% |

Table 52 shows another set of example results of GJB150.10A-2009 fungus test.

| Water contact angle | 136° |
|---|---|
| Oil contact angle | 97° |
| Fungus resistance grade | Grade 2 |
| Degree of surface fungus spots | 4% |

Table 53 shows example underwater immersion test results.

| Underwater energization resistance | | | |
|---|---|---|---|
| | Time for the current to reach 1 mA at certain voltage | | |
| | 3.8 V | 5 V | 12.5 V |
| Electric applicant part | >48 h | >24 h | >24 h |

Table 54 shows another set of example underwater immersion test results.

| Time for the current to reach 1 mA at certain voltage | | |
|---|---|---|
| 3.8 V | 5 V | 12.5 V |
| >70 h | >52 h | >48 h |

Table 55 shows example IPX 7 Waterproof Rating test results with water immersion for 30 min at a depth of 1 m underwater.

| IPX7 Waterproof Rating test | |
|---|---|
| electric appliance part | The part works normally |

Embodiment 17

A method for preparing a multi-functional protective coating through periodic alternating discharge. The plasma discharge mode can be spark discharge applied in a periodic alternating manner. The method can include the following operations:

(1) A target object is positioned into a reaction chamber of protective coating preparation equipment. The reaction chamber is then closed and vacuumed continuously until the vacuum degree in the reaction chamber is 200 millitorr. An inert gas (e.g., Ar) is then introduced into the reaction chamber. The target object can start moving in the reaction chamber using a movement mechanism. The target object can be a solid material. For example, the solid material can be bulk aluminum material. When the target object surfaces are provided with the acidic and alkaline environment resistant coating, the surfaces can be exposed to acidic and alkaline test environments.

In some embodiments, the volume of the reaction chamber can be 1000 L, the temperature in the reaction chamber can be controlled at 60° C., and the incoming flow of the inert gas can be around 300 sccm. In some embodiments, as the target object moves in the reaction chamber, the movement forms a curvilinear reciprocating motion relative to the reaction chamber. The speed of the motion can be 60 mm/min. In some embodiments, the movement forms a planetary motion with a revolution speed of 4 r/min. The auto ration speed can be 2 r/min.

(2) A monomer vapor is then introduced into the reaction chamber until the vacuum degree reaches 300 millitorr, thereby enabling the plasma discharge and the chemical vapor deposition.

(3) The deposition process includes pretreatment and coating phases. In the pretreatment phase, the plasma discharge power can be around 400 W, and the continuous discharge time is 60 s. Subsequently in the coating phase, the discharge power is adjusted to 2000 W, and the time is 600 s. The alternating frequency can be 850 Hz.

In some embodiments, cyclic repetition of the deposition process is used. In the pretreatment phase, the plasma discharge power can be around 150 W, and the time can be around 400 s. Subsequently in the coating phase, the plasma discharge power is adjusted to 100 W, and the time is adjusted to 3000 s. The alternating frequency can be 300 Hz. The pretreatment and coating phases are repeated at least two times to prepare a multi-functional protective coating through chemical vapor deposition on the target object surface.

The discharge power and/or the discharge time in the pretreatment and coating phases can vary for each repetition to achieve the desired multi-layer coating structure. In one example, the discharge power in the pretreatment phase can vary (e.g., from 150 W to 200 W) to account for different surface properties of the target objects and the formed layers. The discharge power in the coating phase is gradually reduced (e.g., from 100 W to 50 W) in each cycle to form denser base layers and looser top layers. The alternating frequency can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 200 millitorr allows the incoming flow of the monomer to be around 10 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor cam be 65%. The monofunctional unsaturated fluorocarbon resins can include 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives can include tripropylene glycol diacrylate and diacrylic gylcol ester.

(4) When the coating is completed, the introduction of the monomer vapor is stopped. The plasma discharge is stopped as well. The reaction chamber is vacuumed continuously (e.g., for about 5 minutes) to reduce the vacuum degree of reaction chamber to 200 millitorr. Regular air is then introduced to the chamber to bring the pressure back to one barometric pressure. The target object then can be removed from the chamber.

Table 56 shows example hydrophobicity/lipophobicity.

| | hydrophobicity/lipophobicity | | |
|---|---|---|---|
| | Water contact angle | Oil contact angle | Adhesion |
| Aluminum material | 123° | 94° | Low adhesion, water droplets easily slipped |

Table 57 shows another example hydrophobicity/lipophobicity.

| hydrophobicity/lipophobicity | | | |
|---|---|---|---|
| | Water contact angle | Oil contact angle | Adhesion |
| Aluminum material | 126° | 97° | Low adhesion, water droplets easily slipped |

Table 58 shows example results of the organic solvent resistance test.

| Material of target object | Chemical reagents | Time | | | |
|---|---|---|---|---|---|
| | | 48 h | 96 h | 144 h | 192 h |
| Aluminum plate | Acetone | pass | pass | pass | pass |
| | Cyclohexane | pass | pass | pass | pass |
| | Petroleum ether | pass | pass | pass | pass |
| | Xylene | pass | pass | pass | pass |
| | 1-Propanol | pass | pass | pass | pass |

Table 59 shows another set of example results of the organic solvent resistance test.

| Chemical reagents | Time | | | |
|---|---|---|---|---|
| | 64 h | 112 h | 160 h | 208 h |
| Acetone | pass | pass | pass | pass |
| Cyclohexane | pass | pass | pass | pass |
| Petroleum ether | pass | pass | pass | pass |
| Xylene | pass | pass | pass | pass |
| 1-Propanol | pass | pass | pass | pass |

Table 60 shows example results of the acidity/alkalinity test.

| Target object | Acid/alkali reagents | Time | | | |
|---|---|---|---|---|---|
| | | 48 h | 96 h | 144 h | 192 h |
| Aluminum plate | Acidic salt spray | pass | pass | pass | pass |
| | Neutral salt spray | pass | pass | pass | pass |
| | Alkaline salt spray | pass | pass | pass | pass |
| | 5% Acetic acid solution | pass | pass | pass | pass |
| | 5% NaOH solution | pass | pass | pass | pass |

Table 61 shows another set of example results of the acidity/alkalinity test.

| Acid/alkali reagents | Time | | | |
|---|---|---|---|---|
| | 64 h | 112 h | 160 h | 208 h |
| Acidic salt spray | pass | pass | pass | pass |
| Neutral salt spray | pass | pass | pass | pass |
| Alkaline salt spray | pass | pass | pass | pass |
| 5% Acetic acid solution | pass | pass | pass | pass |
| 5% NaOH solution | pass | pass | pass | pass |

Embodiment 18

A method for preparing a multi-functional protective coating through periodic alternating discharge. The plasma discharge mode can be radio frequency discharge applied in a periodic alternating manner. The method can include the following operations:

(1) A target object is positioned into a reaction chamber of protective coating preparation equipment. The reaction chamber is then closed and vacuumed continuously until the vacuum degree in the reaction chamber is 120 millitorr. An inert gas (e.g., Ar) is then introduced into the reaction chamber. The target object can start moving in the reaction chamber using a movement mechanism. The target object can be a solid material. For example, the solid material can be bulk aluminum material. When the target object surfaces are provided with a coating resistant to organic solvent immersion and cosmetics, the surfaces can be exposed to the organic solvent test environment.

In some embodiments, the volume of the reaction chamber can be 400 L, the temperature in the reaction chamber can be controlled at 40° C., and the incoming flow of the inert gas can be 150 sccm.

(2) A monomer vapor is then introduced into the reaction chamber until the vacuum degree reaches 160 millitorr, thereby enabling the plasma discharge and the chemical vapor deposition.

(3) The deposition process includes pretreatment and coating phases. In the pretreatment phase, the plasma discharge power can be around 380 W, and the time can be around 400 s. Subsequently in the coating phase, the plasma discharge power is adjusted to around 180 W, and the time is adjusted to around 800 s. The alternating frequency can be 1000 Hz.

In some embodiments, cyclic repetition of the deposition process is used. In the pretreatment phase, the plasma discharge power can be around 180 W, and the time can be around 200 s. Subsequently in the coating phase, the plasma discharge power is adjusted to 60 W, and the time is adjusted to 1500 s. The pretreatment and coating phases are repeated for three times to prepare a multi-functional protective coating through chemical vapor deposition on the target object surfaces.

The discharge power and/or the discharge time in the pretreatment and coating phases can vary for each repetition to achieve the desired multi-layer coating structure. In one example, the discharge power in the pretreatment phase can vary (e.g., from 180 W to 300 W) to account for different surface properties of the target objects and the formed layers. The discharge power in the coating phase is gradually reduced (e.g., from 60 W to 20 W) in each cycle to form denser base layers and looser top layers. The alternating frequency can be adjusted according to the desired layer structure. Similarly, the discharge time can be changed accordingly based on the desired thickness of each layer.

The introduction of the monomer vapor is to atomize and volatilize the monomer through the feeding pump. Introducing the monomer vapor to the reaction chamber by a low pressure of 160 millitorr allows the incoming flow of the monomer to be around 200 μL/min.

In some embodiments, the components of the monomer vapor include a mixture of two monofunctional unsaturated fluorocarbon resins and two polyfunctional unsaturated hydrocarbon derivatives. The mass fraction of the polyfunctional unsaturated hydrocarbon derivatives in the monomer vapor is 33%. The monofunctional unsaturated fluorocarbon resins can include 2-(perfluorodecyl) ethyl methacrylate, 1H, 1H, 2H, 2H-perfluoro octanol acrylate, 3,3,3-trifluoro-1-propyne, and 2-(perfluorohexyl) ethyl methacrylate. The polyfunctional unsaturated hydrocarbon derivatives include tripropylene glycol diacrylate and diethylene glycol divinyl ether.

(4) When the coating is completed, the introduction of the monomer vapor is stopped. The plasma discharge is stopped as well. The reaction chamber is vacuumed continuously (e.g., for about 5 minute or longer) to reduce the vacuum degree of reaction chamber to 160 millitorr. Regular air is then introduced to the chamber to bring the pressure back to one barometric pressure. The target object then can be removed from the chamber.

Table 62 shows example hydrophobicity/lipophobicity

| hydrophobicity/lipophobicity | | | |
|---|---|---|---|
| | Water contact angle | Oil contact angle | Adhesion |
| Aluminum material | 125° | 94° | Low adhesion, water droplets easily slipped |

Table 63 shows example results of the organic solvent resistance test.

| Material of target object | Chemical reagents | Time | | | |
|---|---|---|---|---|---|
| | | 48 h | 96 h | 144 h | 192 h |
| Aluminum material | Acetone | pass | pass | pass | pass |
| | Cyclohexane | pass | pass | pass | pass |
| | Petroleum ether | pass | pass | pass | pass |
| | Xylene | pass | pass | pass | pass |
| | 1-Propanol | pass | pass | pass | pass |

Table 64 shows example results of the acidity/alkalinity test.

| Target object | Acid/alkali reagents | Time | | | |
|---|---|---|---|---|---|
| | | 48 h | 96 h | 144 h | 192 h |
| Aluminum material | Acidic salt spray | pass | pass | pass | pass |
| | Neutral salt spray | pass | pass | pass | pass |
| | Alkaline salt spray | pass | pass | pass | pass |
| | 5% Acetic acid solution | pass | pass | pass | pass |
| | 5% NaOH solution | pass | pass | pass | pass |

In one example aspect, an apparatus for controlling a protective coating process is disclosed. The apparatus comprises a processor, and a memory including processor executable code. The processor executable code upon execution by the processor configures the processor to control one or more electrodes during a chemical vapor deposition process that comprises multiple cycles. Each cycle comprises a pretreatment phase and a coating phase. The one or more electrodes are configured to, for each cycle, apply a first type of a discharge at a first power level for a first time duration in the pretreatment phase, and apply a second type of a discharge at a second power level for a second time duration in the coating phase. The second power level is lower than the first power level. The processor is further configured to adjust, for different cycles in the chemical vapor deposition process, at least one of: the first type of discharge, the second type of discharge, the first power level, the second power level, the first time duration, or the second time durations.

In some embodiments, the processor is configured to operate in a plurality of modes based on a combination of discharge types, power levels, and/or time durations (e.g., as described in Embodiments 1 to 18) so as to produce a multi-layer coating structure in which different layers may have different thicknesses and/or densities to satisfy different protection requirements. For example, the controller can operate in a first mode in which a pulse discharge is applied in the coating phase of a first cycle. The controller is then configured to operate in a second mode in which a periodic alternating discharge is applied in the coating phase of a second cycle. The controller is also configured to operate in a third mode in which a continuous discharge is applied in the coating phase of a third cycle. The resulting coating has multiple layers, each with a different thickness and/or density.

In some embodiments, the discharge applied in the chemical vapor deposition process comprises a radio frequency discharge, a microwave discharge, an intermediate frequency discharge, a high frequency discharge, or a spark discharge. In some embodiments, the first type of discharge comprises a continuous discharge. In some embodiments, the first power level is in a range of 120 to 400 W. In some embodiments, the first time duration is between 600 to 7200 seconds.

In some embodiments, the second type of discharge comprise a continuous discharge, a pulse discharge, or a periodic alternating discharge. In some embodiments, the second power level is in a range of 10 to 250 W. In some embodiments, the second time duration is between 600 to 7200 seconds.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:
1. A method for preparing a protective coating, comprising:
positioning one or more target objects into a chamber, wherein the chamber comprises a movable substrate and one or more trays coupled to the movable substrate configured to hold the one or more target objects such that the one or more target objects are movable within the chamber;

adding a monomer vapor into the chamber;

forming a first layer of a protective coating on surfaces of the one or more target objects using the monomer vapor by performing a first cycle of a chemical vapor deposition process, wherein the first cycle comprises:
  in a first pretreatment phase, removing impurities from the surfaces of the one or more target objects and activating the surfaces of the one or more target objects by applying a continuous discharge for a first time duration between 60 to 900 seconds; and
  in a first coating phase, forming the first layer of the protective coating on the activated surfaces of the one or more target objects by applying a second type of discharge at a second power level for a second time duration; and forming a second layer of the protective coating on surfaces of the first layer of the protective coating using the monomer vapor by performing a second cycle of the chemical vapor deposition process, the second layer of protective coating having a different thickness as compared to the first layer of the protective coating, wherein the second cycle comprises:
  in a second pretreatment phase, removing impurities from the surfaces of the first layer and activating the surfaces of the first layer by applying the continuous discharge for a second time duration between 60 to 900 seconds; and
  in a second coating phase, forming the second layer of the protective coating on the activated surfaces of the first layer by applying a third type of discharge at a third power level for a third time duration that is different than the second time duration.

2. The method of claim 1, comprising:
applying different types of discharges at different power levels for different time durations in different cycles.

3. The method of claim 1, wherein the discharge applied in the chemical vapor deposition process comprises a radio frequency discharge, a microwave discharge, an intermediate frequency discharge, a high frequency discharge, or a spark discharge.

4. The method of claim 1, wherein performing the chemical vapor deposition process comprises:
applying the continuous discharge at a power level in a range of 120 to 400 W in the first pretreatment phase or the second pretreatment phase.

5. The method of claim 1, wherein the second type or the third type of discharge comprises a continuous discharge.

6. The method of claim 1, wherein the second type or the third type of discharge comprises a pulse discharge that has a duty cycle between $\frac{1}{800}$ and 1.

7. The method of claim 6, wherein the pulse discharge is applied at a pulse frequency between 1 to 100 Hz.

8. The method of claim 1, wherein the second type or the third type of discharge comprises a periodic alternating discharge.

9. The method of claim 8, wherein the periodic alternating discharge is applied at an alternating frequency is between 1 to 1000 Hz.

10. The method of claim 1, wherein performing the chemical vapor deposition process comprises:
applying the second type or the third type of discharge at a power level in a range of 10 to 250 W and for a time duration between 600 to 7200 seconds.

11. The method of claim 1, comprising:
reducing, after positioning the one or more target objects into the chamber, a pressure in the chamber to reach between 10 to 200 millitorr.

12. The method of claim 1, comprising:
adding an inert gas into the chamber prior to adding the monomer vapor.

13. The method of claim 12, wherein the inert gas includes Argon or Helium.

14. The method of claim 1, wherein the monomer vapor includes a mixture of two monofunctional unsaturated fluorocarbon resins and two polyfunctional unsaturated hydrocarbon derivatives.

15. The method of claim 1, comprising:
applying a motion to the movable substrate to drive a movement of the one or more target objects, wherein the motion comprises a circular motion, a planetary motion, a linear reciprocating motion, or a curvilinear reciprocating motion relative to the chamber.

* * * * *